US009139917B2

(12) United States Patent
O'Brien et al.

(10) Patent No.: US 9,139,917 B2
(45) Date of Patent: Sep. 22, 2015

(54) TRANSPARENT CONDUCTIVE POROUS NANOCOMPOSITES AND METHODS OF FABRICATION THEREOF

(75) Inventors: Paul Gregory O'Brien, Toronto (CA); Daniel P. Puzzo, Waterloo (CA); Nazir Pyarali Kherani, Toronto (CA); Geoffrey Alan Ozin, Toronto (CA); Alongkarn Chutinan, Toronto (CA); Zheng-Hong Lu, Toronto (CA); Michael G. Helander, Toronto (CA)

(73) Assignees: Paul Gregory O'Brien, Toronto, Ontario (CA); Daniel P. Puzzo, Waterloo, Ontario (CA); Nazir Pyarali Kherani, Toronto, Ontario (CA); Geoffrey Alan Ozin, Toronto, Ontario (CA)

( * ) Notice: Subject to any disclaimer, the term of this patent is extended or adjusted under 35 U.S.C. 154(b) by 504 days.

(21) Appl. No.: 13/502,348

(22) PCT Filed: Oct. 15, 2010

(86) PCT No.: PCT/CA2010/001617

§ 371 (c)(1), (2), (4) Date: Aug. 8, 2012

(87) PCT Pub. No.: WO2011/044687

PCT Pub. Date: Apr. 21, 2011

(65) Prior Publication Data

US 2012/0305061 A1 Dec. 6, 2012

Related U.S. Application Data

(60) Provisional application No. 61/252,457, filed on Oct. 16, 2009.

(51) Int. Cl.

*H01L 31/0236* (2006.01)
*C25B 1/00* (2006.01)

(Continued)

(52) U.S. Cl.

CPC ............... *C25B 1/003* (2013.01); *C03C 17/006* (2013.01); *H01B 1/08* (2013.01);

(Continued)

(58) Field of Classification Search

USPC .................................................. 136/252–265

See application file for complete search history.

(56) References Cited

U.S. PATENT DOCUMENTS 6,206,065 B1 3/2001 Robbie et al.
6,870,266 B2 3/2005 Nakamura et al.

(Continued)

FOREIGN PATENT DOCUMENTS

WO 2006/076613 7/2006
WO 2007/015250 2/2007

OTHER PUBLICATIONS

Tay et al., Planar Photonic Crystals Infiltrated with Nanoparticle/Polymer Composites, Applied Physics Letters, vol./Issue 91 221109, pp. 1-3 (2007).*

(Continued)

*Primary Examiner* — Jayne Mershon

(57) ABSTRACT

A nanocomposite material that is both transparent and electrically conductive is provided. The nanocomposite comprises a nanoporous matrix, preferably formed from nanoparticles, that is internally coated with a transparent conductive material to define an internal conductive path within the nanocomposite. The nanocomposite is substantially transparent over a defined spectral range that preferably includes at least a portion of the visible spectrum, and preferably comprises pores with a mean diameter of less than approximately 25 nm. A bilayer may be formed by depositing a layer of a transparent conductive material on top of a nanocomposite layer, or by depositing a second layer of a nanocomposite having different optical properties. The nanocomposites formed using a combination of sequential and/or concurrent deposition techniques are correspondingly discrete and/or continuously varying structures. Multilayer structures, such as photonic crystal reflectors, may be formed by depositing multiple bilayers, and integrated into devices such as tandem solar cells.

17 Claims, 13 Drawing Sheets

100
110
130
(a)
120

(b)
Absorption/Reflection
a-Si:H
a-Si:H (No IR)
Reflection
Wavelength (nm)

(51) Int. Cl.

| | |
|---|---|
| ***H01L 31/054*** | (2014.01) |
| ***C03C 17/00*** | (2006.01) |
| ***H01B 1/08*** | (2006.01) |
| ***H01L 31/0224*** | (2006.01) |
| ***H01L 31/0368*** | (2006.01) |
| ***H01L 31/0376*** | (2006.01) |
| ***H01L 31/072*** | (2012.01) |
| ***H01L 31/0725*** | (2012.01) |
| ***H01L 51/52*** | (2006.01) |
| ***H01L 31/056*** | (2014.01) |
| ***H02S 40/44*** | (2014.01) |
| *H01L 33/46* | (2010.01) |

(52) U.S. Cl.

CPC . *H01L 31/022466* (2013.01); *H01L 31/03685* (2013.01); *H01L 31/03762* (2013.01); *H01L 31/056* (2014.12); *H01L 31/0549* (2014.12); *H01L 31/072* (2013.01); *H01L 31/0725* (2013.01); *H01L 51/5206* (2013.01); *H01L 51/5265* (2013.01); *H02S 40/44* (2014.12); *C03C 2217/425* (2013.01); *H01L 33/46* (2013.01); *Y02E 10/52* (2013.01); *Y02E 10/545* (2013.01); *Y02E 10/548* (2013.01); *Y02E 10/60* (2013.01); *Y02E 60/366* (2013.01); *Y10T 428/249953* (2015.04)

(56) References Cited

U.S. PATENT DOCUMENTS

| | | | | |
|---|---|---|---|---|
| 7,169,715 | B2 | 1/2007 | Ott et al. | |
| 7,253,017 | B1 | 8/2007 | Roscheisen et al. | |
| 7,594,982 | B1 * | 9/2009 | Roscheisen et al. | 204/284 |
| 7,790,067 | B2 | 9/2010 | ZaBan et al. | |
| 2006/0189113 | A1 | 8/2006 | Vanheusden et al. | |
| 2010/0236625 | A1 * | 9/2010 | Kenney et al. | 136/259 |
| 2011/0164308 | A1 * | 7/2011 | Arsenault et al. | 359/322 |

OTHER PUBLICATIONS

Refractive Index Database, http://refractiveindex.info, downloaded Nov. 16, 2014.*

Kenney et al., U.S. Appl. No. 61/220,741, filed Jun. 26, 2009.*

D. Fattakhova-Rohlfing, T. Brezesinski, J. Rathuosky, A. Feldhoff, T. Oekermann, M. Wark, B. Smarsly, Adv. Mater. 18, 2980-2983 (2006). "Transparent Conducting Films of Indium Tin Oxide with 3D Mesopore Architecture".

C. Goebbert, R. Nonninger, M.A. Aegerter, H. Schmidt, Thin Solid Films, 351, 79-84, (1999) "Wet chemical deposition of ATO and ITO coatings using crystalline nanoparticles redispersable in solutions".

T. G. Conti, A. J. Chiquito, R. O. da Silva, E. Longo, E. R. Leite, J. Am. Ceram. Soc., p. 1-5, (2010) "Electrical Properties of Highly Conducting SnO2:Sb Nanocrystals Synthesized Using a Nonaqueous Sol-Gel Method".

H. Lin, T. Jin, A. Dmytruk, M. Saito, T. Yazawa, J. Photochem. Photobiol., A, 164, 173-177, (2004) "Preparation of a porous ITO electrode".

M.C. Fuertes, F.J. López-Alcaraz, M.C. Marchi, H.E. Troiani, V. Luca, H. Miguez, G. J. De A.A, Soler-Illia, Adv. Funct. Mater. 17, 1247-1254 (2007) "Photonic crystals from ordered nanoporous thin-film functional building blocks".

S. Colodrero, M. Ocaña, H. Miguez, Langmuir, 24, 4430-4434 (2008) "Nanoparticle-based one-dimensinal photonic crystals".

7. S. Kawakami, Electron. Lett. 33, 1260-1261 (1997) "Fabrication of submicrometre 3D periodic structures composed of Si/SiO2".

C.C. Cheng, A. Scherer, R. Tyan, Y. Fainman, G. Witzgall, E. Yablonovitch, J. Vac. Sci. Technol. B 15(6), 2764-2767 (1997) "New Fabrication Techniques for High Quality Photonic Crystals".

L. Li, M. Liming, D. Xuechen, Mater. Res. Bull., 41, 541-546 (2006) "Solvothermal synthesis and characterization of Sb-doped SnO2 nanoparticles used as transparent conductive films".

A. Bielawny et al., "3D photonic crystal intermediate reflector for micromorph thin-film tandem solar cell", Phys. Stat. Sol. (2) 205, 2796 (2008).

J. Dong and H. D. Gafney, "Fabrication and patterning surface conductive porous glass", J. Non-Crystalline Solids 203, 329-333 (1996).

K. Daoudi et al., "ITO spin-coated porous silicon structures", Mat. Sci. and Eng. B101, 262-265 (2003).

H. Lin et al., "Preparation of a Translucent, Conductive, Porous Nanocomposite", J. Am. Ceram. Soc., 86, 1991-93 (2003).

Patent Cooperation Treaty International Search Report. PCT/CA2010/001612. Completed Feb. 10, 2011. Mailed Mar. 7, 2011.

* cited by examiner

TRANSPARENT CONDUCTIVE POROUS NANOCOMPOSITES AND METHODS OF FABRICATION THEREOF

CROSS-REFERENCE TO RELATED APPLICATION

This application is a National Phase application claiming the benefit of PCT/CA2010/001617 filed on Oct. 15,2010, in English, which further claims priority to U.S. Provisional Application No. 61/252,457, titled "SELECTIVELY TRANSPARENT AND CONDUCTING PHOTONIC CRYSTALS" and filed on Oct. 16, 2009, the entire contents of which are incorporated herein by reference.

FIELD OF THE INVENTION

The invention relates to transparent conductive porous nanocomposites and optical devices employing conductive transparent layers.

BACKGROUND OF THE INVENTION

Nanoporous, transparent and conducting films are a novel class of materials that exhibit a unique combination of material properties including transparency, conductivity, well-defined three-dimensional porosity and a large specific surface area. Their built-in continuous network of nanoscale voids provides two distinct advantages over conventional solid thin-film transparent conducting oxides (TCOs). Firstly, their continuously interconnected pore volume can be infiltrated with numerous different reactive species to fabricate devices with a large specific surface area. Secondly, some degree of control can be asserted over the effective index of refraction of mesoporous transparent and conducting films by tuning their degree of porosity.

Such materials have been employed as transparent elements within active optical devices. For example, dye-sensitized solar cells (DSSCs) have been fabricated by infiltrating the voids within titania ($TiO_2$) nanoparticle films with a photosensitive dye and an electrolyte. The nanoscale porosity of the $TiO_2$ nanoparticle film provides the large specific surface area required to adsorb sufficient amounts of light-harvesting molecules within the DSSC.

An advantage of nanoporous transparent and conducting films is that their properties can be tuned by controlling their degree of porosity. For example, silica has an index of refraction of about 1.5 at a wavelength of 600 nm, while a nanoparticle film composed of silica nanoparticles with a porosity of 27% exhibits an effective index of refraction of about 1.3.

Numerous methods of fabricating nanoporous transparent and conducting films have been reported in the literature. For example, such films have been fabricated using the Evaporation-Induced Self-Assembly (EISA) process.[1] More specifically, Fattakhova et al. have used poly(ethylene-co-butylene)-b-poly(ethylene oxides), referred to as "KLE's", as block co-polymers in the EISA process to prepare crystalline and transparent indium tin oxide (ITO) layers with well-ordered, accessible nanoporosity and good electrical conductivity.[2]

As another example, porous TCO films can be prepared by glancing angle deposition (GLAD) (U.S. Pat. No. 6,206,065). In the GLAD process, a thin film of plural columns extending from a surface of a substrate are initially formed. These columns are referred to as "seed posts" which are exposed to a vapor flux incident at an oblique angle. During the deposition, these seed posts grow in a columnar fashion while shadowing the surrounding regions from the incoming flux of vapor. Furthermore, the growth direction of the columns can be controlled by altering the oblique angle from which the vapor flux arrives. The resulting films are anisotropic, porous, and highly structured.

Nanostructured transparent conducting electrodes have also been made by infiltrating a nanoporous structure with a conducting material by means of electrodeposition (U.S. Pat. No. 7,594,982). In this three-step process a transparent conducting layer is first deposited onto a substrate. Secondly, a nano-architected porous film with interconnected pores is deposited onto the transparent conducting layer. Although this nano-porous film must be made from a transparent material, it does not necessarily need to be made from a conductive material, thus as an example, a porous silica film formed using the EISA technique would suffice. In the third and final step electrodeposition is used to fill the pores in with a conducting material.

In yet another example, Lin et al. [5] prepared porous electrodes by using metallorganic chemical vapour deposition (MOCVD) to deposit indium tin oxide (ITO) into the void space of a porous glass matrix. However, the transmittance of these porous glass-ITO composite films was low on account of the visible light being scattered by its micropores. In particular, the optical transparency of the composites was just 32% when measured with an integrating sphere in order to include diffusely transmitted light.

Another method of fabricating nanoporous transparent conducting electrodes is to simply spin- or dip-coat preformed nanoparticles dispersed in solution onto flat substrates.[3,4] Although the transparency of these films can be made to be quite high (>90% in the visible), they must be annealed at high temperatures (of about 500° C.) in order to lower their resistivity.

Recently, nanoporous films have been employed as elements of photonic crystal devices. The possibility of utilizing photonic crystals to manipulate light was first introduced independently by both Yablonovitch and John.[5,6] In short, photonic crystals are a unique class of optical materials that interact with electromagnetic waves causing them to diffract and form interference patterns within the photonic crystal, giving rise to many interesting optical phenomena. For example, photonic crystals can be engineered to possess a photonic band-gap (PBG) over a specified spectral range within which light cannot propagate; in this case incident light will undergo 100% reflection.

Bragg-reflectors, also recognized as one-dimensional photonic crystals (1 D photonic crystals),[8] have been subjected to scientific investigation since the $19^{th}$ century when Lord Rayleigh showed that light within a specified spectral range incident onto their surface undergo complete reflection.[5] Today, the optical properties of Bragg-reflectors are well-understood, where theoretical advances in the field have shown that 1D photonic crystals can be used to construct optical diodes, which reflect light incident from one side while transmitting light incident from the other side,[10] and omnidirectional reflectors, which completely reflect incident photons over a specified spectral range regardless of their incident angle or polarization.[11,12] Furthermore, owing to their simplicity, Bragg-reflectors have been used to construct numerous optical devices such as Fabry-Perot interferometers,[13] optical resonators for distributed feedback lasers,[14] and optical cavities for controlling the spontaneous emission rates and spectra from emitting media,[15] which is particularly useful for light emitting diodes.

Bragg-reflectors are most commonly fabricated by alternately depositing films from two materials having a differing index of refraction onto a flat substrate. For example, one bi-layer within a Bragg-reflector can be fabricated by first depositing a film from “material A” and then subsequently depositing a film from “material B”. Using this procedure, any number of bilayers can be successively deposited in order to build up the Bragg-reflector to a desired thickness. Moreover, the thickness of the films within the Bragg-reflector can be easily manipulated in order to set the spectral position of the Bragg-diffraction peak at a desired wavelength. Likewise photonic defect states can be easily incorporated into these Bragg-reflectors by appropriately tuning the thicknesses of selected layers during the fabrication process.

The aforementioned method of fabricating Bragg-reflectors can be modified in order to create two- and three-dimensional photonic crystals. One method of achieving this is to deposit the Bragg reflector onto a two- or three-dimensionally patterned substrate.[23] A second method is to etch either a two- or three dimensional pattern through the Bragg reflector. This may be done using electron beam lithography, ion beam etching or other dry or wet etching techniques. The pattern etched through the Bragg reflector may be an array of holes or lines and may be aligned normal to the substrate surface or at an arbitrary angle through the use of, for example, angle ion beam etching.[24] The periodicity of two- or three-dimensional photonic crystals formed in this manner can be set by tuning the thickness of the layers within the structure. Also, photonic defect states can be purposely introduced into these two- or three-dimensional photonic crystals either by altering the thickness of certain layers within the structure or by altering the pattern etched through the structure at specific points.

Recent advances in the field of 1D photonic crystals have involved fabricating Bragg-reflectors from novel nanomaterials primarily to impart added functionality to the photonic material.[16,17] For example, Bragg-reflectors made from nanoporous titania ($TiO_2$) and silica ($SiO_2$) films prepared via template directed sol-gel methods can be employed as color-tunable sensors because the built-in porosity enables the surrounding environment to infiltrate the 1D photonic crystal thereby altering its optical properties, namely the effective refractive indices, and hence its reflectance characteristics.[18,19]

As a second example, photoconductive Bragg reflectors have been made by alternately spin-coating $TiO_2$ nanoparticle films of two different degrees of porosity and subsequently infiltrating their pores with ruthenium dye.[20] Furthermore, Bragg reflectors made of alternating layers of spin-coated $SiO_2$ and $TiO_2$ nanoparticle films have been fabricated on the rear side of dye-sensitized solar cells (DSSCs) in order to reduce transmission losses by reflecting transmitted light back into the cell.[21,22] In this case the porous structure of the nanoparticle films is occupied by an electrolyte thereby providing the necessary pathway for charge transport through the DSSC.

In another example, a conductive inverse opal photonic crystal has been reported by Bielawny et al. [46], where the inverse opal is formed by infiltrating a poly(methyl methacrylate) opal template with zinc oxide. The conductive inverse opal was integrated into a tandem solar cell as an intermediate reflector for enhancing the efficiency of the solar cell. Unfortunately, such devices, in which 3D photonic crystals are templated and then inverted through numerous process steps, are complex and costly to manufacture.

SUMMARY OF THE INVENTION

Provided herein are conductive and transparent porous nanocomposites and methods of their fabrication. The nanocomposites are fabricated by depositing small and controlled amounts of a conductive material onto and into the pores of a nanoporous transparent matrix, thus forming a coating on internal surfaces of the nanoporous matrix and defining a conductive path within the resulting nanocomposite. The nanocomposite structures are formed using bottoms-up synthesis techniques involving a combination of sequential and/or concurrent depositions thus rendering discretely and/or continuously varying structures. The nanoporous matrix is formed from a transparent material, but need not be conductive. Additional embodiments provide photonic crystal device based on bilayers that are composed at least in part of the aforementioned porous nanocomposites.

Accordingly, in a first aspect, there is provided a porous nanocomposite comprising a porous nanoparticle matrix internally coated with a transparent conductive material, the transparent conductive material defining a conductive path within the nanoparticle matrix; wherein the porous nanocomposite is substantially transparent over a defined spectral range. The defined spectral range preferably comprises at least a portion of the visible spectrum, and the conductive path preferably extends across a thickness of the porous nanocomposite.

The transparent conductive material may be selected from the group consisting of metallic films that are sufficiently thin to exhibit transparency, semiconductors, doped semiconductors, doped carbon films, and organic transparent conducting films, and is preferably a transparent conductive oxide, such as indium-tin-oxide or zinc oxide. The transparent conductive material may alternatively comprise a transparent conductive polymer, such as poly(3,4-ethylenedioxythiophene).

A mean pore diameter of the nanoparticle matrix is preferably less than about 25 nm. The nanoparticle matrix preferably comprises nanoparticles selected from the group consisting of antimony-tin-oxide nanoparticles, silica nanoparticles, tin oxide nanoparticles, and titanium dioxide nanoparticles, and may comprise a property selected from the group consisting of magnetic, luminescent, and exhibiting a plasmon resonance before and/or after being infiltrated and coated with the transparent conductive material. Nanoparticles forming the nanoparticle matrix preferably have a shape selected from the group consisting of spherical, cylindrical, disks, platelets, hollow spheres and tubes. Nanoparticles forming the nanoparticle matrix preferably comprise a material selected from the group consisting of metals, metal oxides, semiconductors, polymers, carbon materials, and organics. Nanoparticles forming the nanoparticle matrix may further comprise a surface that is one of passivated, modified using surfactants, oxidized, functionalized, and bound and/or coated with a bio-recognition species.

A volume fraction of the transparent conductive material may vary across a thickness of the porous nanocomposite, or be substantially constant across a thickness of the porous nanocomposite.

In another aspect, there is provided a porous nanocomposite bilayer comprising: a first nanocomposite layer as described above, wherein the transparent conductive material is a first transparent conductive material; and a substantially solid layer formed on the nanocomposite layer, the solid layer comprising a second transparent conductive material.

The first transparent conductive material and the second transparent conductive material may comprise a common transparent conductive material, where the nanoparticle matrix preferably comprises the common transparent conductive material. Alternatively, the second transparent conductive material may comprise a transparent conductive oxide or a transparent conductive polymer.

In another aspect, there is provided a porous nanocomposite bilayer comprising: a first porous nanocomposite layer as described above, wherein the matrix is a first matrix and the transparent conductive material is a first transparent conductive material; a second porous nanocomposite layer as described above, wherein the matrix is a second matrix and the transparent conductive material is a second transparent conductive material.

The first and second transparent conductive materials preferably comprise a transparent conductive oxide, and wherein the first and second matrices are comprised of nanoparticles, where more preferably, the transparent conductive oxide comprises indium-tin-oxide; the first matrix comprises silica nanoparticles; and the second matrix comprises titania nanoparticles.

In another aspect, there is provided a multilayer nanocomposite comprising two or more porous nanocomposite bilayers as described above. The multilayer nanocomposite preferably comprises a photonic crystal. A thickness of one of the bilayers may be selected to form a photonic defect state, or a chirped photonic crystal structure.

A photonic band gap of the photonic crystal preferably lies within at least a portion of the visible spectrum. The multilayer may further have a two dimensional periodic array of holes formed therethrough. Alternatively, the multilayer nanocomposite may be formed such that a substrate on which the bilayers are provided comprises a two-dimensional spatial relief pattern for imparting a three-dimensional periodic structure to the multilayer nanocomposite.

In yet another aspect, there is provided a tandem solar cell comprising a first photovoltaic region, an intermediate reflector comprising a multilayer nanocomposite as described above, a second photovoltaic region, wherein a photonic band gap of the photonic crystal comprises a spectral range corresponding to at least a portion of an absorption band of the first photovoltaic region.

In another aspect, there is provided a light emitting diode comprising a microcavity, wherein an active layer of the light emitting diode lies within the microcavity, and wherein a conductive reflector forming the microcavity and providing a conductive layer for electrically contacting the light emitting diode comprises a multilayer nanocomposite as described above.

In another aspect, there is provided a photovoltaic system comprising: a photovoltaic cell configured to absorb light within a first spectral region and transmit light within a second spectral region; and an intermediate reflector comprising a multilayer nanocomposite as described above; wherein a photonic band gap of the photonic crystal comprises a spectral range corresponding to at least a portion of the first spectral region; and wherein the intermediate reflector electrically contacts the photovoltaic cell.

In yet another aspect, there is provided a porous nanocomposite comprising a porous matrix internally coated with a transparent conductive material, the transparent conductive material defining a conductive path within the porous matrix; wherein the porous nanocomposite is substantially transparent over at least a portion of the visible spectrum. The porous matrix comprises a porous glass or nanoparticles.

In another embodiment, there is provided a method of fabricating a porous nanocomposite, the method comprising the steps of: coating a substrate with a layer of nanoparticles to form a porous nanoparticle matrix; and internally coating the nanoparticle matrix with a transparent conductive material; wherein the nanoparticles and the transparent conductive material are selected such that the porous nanocomposite is substantially transparent over a defined spectral range. The transparent conductive material is preferably deposited by a vacuum deposition method. The defined spectral range is selected to comprise at least a portion of the visible spectrum.

The transparent conductive material may be deposited by a method selected from the group consisting of sputter deposition, ion beam deposition, and physical vapour deposition.

The nanoparticle matrix is preferably formed using a method selected from the group consisting of sputtering, spin-coating, dip-coating, drop-casting, spray-coating, pulsed laser deposition and electrospinning.

The transparent conductive material preferably comprises a transparent conductive oxide, such as indium-tin-oxide and zinc oxide, and may alternatively comprise a transparent conductive polymer, such as poly(3,4-ethylenedioxythiophene).

The nanoparticles are preferably selected to comprise a mean size of less than about 30 nm, and are preferably selected from the group consisting of antimony-tin-oxide nanoparticles, silica nanoparticles, tin oxide nanoparticles, and titanium dioxide nanoparticles.

The method may further comprise the step of controlling a deposition rate of the transparent conductive material to obtain a volume fraction of the transparent conductive material that varies across a thickness of the porous nanocomposite.

The porous nanoparticle matrix may be deposited by sputtering a nanoparticulate sputtering target, and wherein the transparent conductive material is deposited by sputtering a solid sputtering target. The steps of sputtering the nanoparticulate sputtering target and sputtering the solid sputtering target are preferably performed simultaneously when forming the porous nanocomposite.

The method preferably further comprises the step of forming a bilayer by depositing a substantially solid layer of an additional transparent conductive material on the nanocomposite. Alternatively, a bilayer may be formed by depositing a second nanocomposite layer on the first nanocomposite layer, wherein the second nanocomposite layer comprises a second nanoparticle matrix and a second transparent conductive material. The first and second transparent conductive materials preferably comprise a transparent conductive oxide, and more preferably, the transparent conductive oxide comprises indium-tin-oxide; the first nanoparticle matrix comprises silica nanoparticles; and the second nanoparticle matrix comprises titania nanoparticles.

One or more additional bilayers may be deposited to form a multilayer porous nanocomposite, where a thickness of each bilayer is preferably selected to form a periodic multilayer porous nanocomposite. More preferably, the thickness of each bilayer in the periodic multilayer porous nanocomposite is selected to produce a photonic band gap in the defined spectral range.

In still another aspect, there is provided a photocatalytic water splitting apparatus comprising; a catalyst comprising a porous nanoparticle matrix; and a co-catalyst internally coating the porous nanoparticle matrix and comprising one of a noble metal and a semiconductor; wherein an electronic band gap of the catalyst exceeds an electronic band gap of the co-catalyst. The catalyst preferably comprises titania.

A further understanding of the functional and advantageous aspects of the invention and the versatility of the methods of fabrication can be realized by reference to the following detailed description and drawings.

BRIEF DESCRIPTION OF THE DRAWINGS

Preferred embodiments of the invention will now be described, by way of example only, with reference to the drawings, in which.

DETAILED DESCRIPTION OF THE INVENTION

Figure 1:
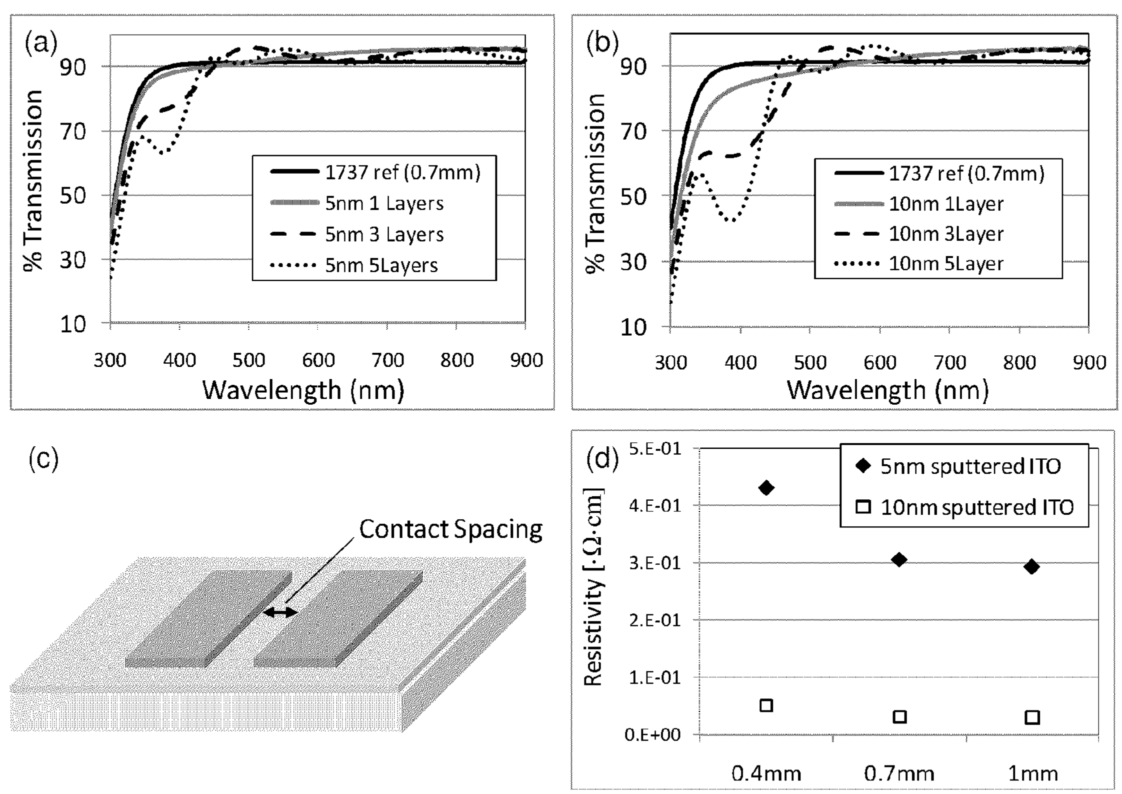
FIG. 1 shows the transmission through conductive nanoporous films that were subjected to either about (a) 5 nm and (b) 10 nm of ITO sputtering during their fabrication process; (c) provides a schematic diagram of the configuration used to measure the resistivity of the nanoporous transparent and conducting films; and (d) plots the resistivity of the nanoporous transparent and conducting films.

Generally speaking, the systems described herein are directed to transparent conductive porous nanocomposites and devices, and method of fabrication thereof. As required, embodiments of the present invention are disclosed herein. However, the disclosed embodiments are merely exemplary, and it should be understood that the invention may be embodied in many various and alternative forms. The Figures are not to scale and some features may be exaggerated or minimized to show details of particular elements while related elements may have been eliminated to prevent obscuring novel aspects. Therefore, specific structural and functional details disclosed herein are not to be interpreted as limiting but merely as a basis for the claims and as a representative basis for teaching one skilled in the art to variously employ the present invention. For purposes of teaching and not limitation, the illustrated embodiments are directed to transparent conductive nanoparticle-based nanocomposites and devices, and method of fabrication thereof.

As used herein, the terms, "comprises" and "comprising" are to be construed as being inclusive and open ended, and not exclusive. Specifically, when used in this specification including claims, the terms, "comprises" and "comprising" and variations thereof mean the specified features, steps or components are included. These terms are not to be interpreted to exclude the presence of other features, steps or components.

As used herein, the terms "about" and "approximately", when used in conjunction with ranges of dimensions of particles, compositions of mixtures or other physical properties or characteristics, are meant to cover slight variations that may exist in the upper and lower limits of the ranges of dimensions so as to not exclude embodiments where on average most of the dimensions are satisfied but where statistically dimensions may exist outside this region. It is not the intention to exclude embodiments such as these from the present invention.

As used herein, the term "mesoporous" refers to porous structures comprising pores having a mean diameter ranging from approximately 2 nm to 50 nm.

Disclosed herein are transparent conductive porous nanocomposites and their methods of fabrication. Also disclosed are nanocomposite photonic crystals that are porous, transparent, conductive, and readily adapted to a wide range of uses and applications. In particular, conducting transparent photonic crystals based on multilayer porous nanocomposites can be used as intermediate reflectors in multi-junction photovoltaic devices, photovoltaic-thermal (PV/T) systems, and building integrated photovoltaics (BIPV), and linewidth narrowing elements in light emitting diode microcavity structures.

According to a preferred embodiment, a transparent conductive porous nanocomposite is fabricated by depositing a controlled amount of a transparent conducting material onto and into a transparent nanoporous matrix. The porous matrix comprises an internal network of interconnected pores, and the coating of the internal surface of the pores creates an internal conductive path within the nanocomposite.

The nanoporous matrix may comprise any porous material that is transparent prior to infiltration. The nanoporous matrix need not be electrically conductive, as conductivity is conferred by the deposition of the transparent conductive material within the pores.

The deposition process is preferably a vapor phase process that deposits the transparent conductive material within the porous matrix while preserving the porous structure of the matrix after deposition. Preserving the porous nature of the matrix is particularly useful in forming bilayers with substantially different indices of refraction, and for forming photonic crystals based on multiple bilayers.

In a preferred embodiment, the porous matrix is formed via the deposition and/or growth of nanoparticles, preferably as a film. The porous matrix is preferably formed from antimony-tin-oxide nanoparticles, silica nanoparticles, tin oxide nanoparticles, and titanium dioxide nanoparticles, and may alternatively comprise metals, metal oxides, semiconductors, polymers, carbon materials, and organics. In one embodiment, the nanoparticles are nanocrystals. Nanoparticles forming a nanoporous matrix that is transparent in the visible spectrum preferably have a size of less than approximately 30 nm, and thereby produce pores with a size of less than about 10-20 nm, depending on their shape and dispersity, which results in minimal Rayleigh scattering in the visible spectrum.

The nanoparticles may be magnetic, luminescent, and/or exhibit a plasmon resonance before and/or after being infiltrated and coated with said transparent conductive material. Suitable shapes for forming nanoparticlelayers include spheres, cylinders, disks, platelets, hollow spheres and tubes. The surface of the nanoparticles may be prepared by passivation, oxidization, modification via surfactants, functionalized, or bound and/or coated with a bio-recognition species such as a ligand, antibody, aptamers or nucleic acid.

Preferred methods for deposition and formation of the nanoparticle matrix include, but are not-limited to, ink-jet printing and evaporation-induced self-assembly (EISA), sol-gel methods, spin-coating, spray coating and dip-coating.

In another embodiment, a porous nanoparticle film for forming a nanocomposite according to embodiments of the invention may be formed by sputtering. For example, it has recently been shown that magnetron sputtering with Ar gas at relatively high pressures can be used to deposit $WSi_2$ nanoparticles under the proper deposition conditions [47]. When the background pressure of the Ar gas is sufficiently high, the mean free path of the sputtered $WSi_2$ atoms decreases on account of their increased number of collisions with the Ar atoms. Consequently, the highly energetic $WSi_2$ atoms emitted from the sputtering target undergo a thermalization process and their concentration in the gas phase also increases. Aggregation in the gas phase occurs when there is a high concentration of $WSi_2$ atoms with sufficiently low thermal velocities. Although this study refers to $WSi_2$ nanoparticles, similar methods could be used to sputter TCO nanoparticles. Furthermore, the density, concentration and characteristics of the TCO target used in the sputtering process can be chosen to optimize the deposition of TCO nanoparticles.[48.49]

In one non-limiting example, the TCO target itself may be comprised of loosely bound nanoparticles that are ejected from the target during the sputtering process. In this configuration the size and monodispersity of the nanoparticles deposited onto a substrate may be controlled by setting the distance between the substrate and the target or by creating an electric or magnetic field within the sputter deposition chamber to tune the flux of nanoparticles arriving at the substrate surface. Such control over the nanoparticle size and monodispersity provides control over the size of the pores formed in the transparent porous layer.

In a preferred embodiment, two deposition targets are simultaneously co-sputtered for depositing a substantially homogenous coated nanoparticle layer to form a transparent conductive porous nanocomposite. One target comprises loosely bound nanoparticles, which are ejected via sputtering, and a second target comprises a solid TCO that produces a uniformly layer upon sputtering. By co-sputtering both targets simultaneously, ejected nanoparticles are coated with the TCO material in-situ, and the deposited TCO-coated nanoparticles form a porous matrix and coated with TCO to form a continuous conductive network within the transparent nanoporous film.

Sputtered films may be subjected to dry-etching processes to alter their porosity in order to tune their refractive index. Furthermore, the degree of porosity of the sputtered films may be tuned through the use of glancing angle deposition (GLAD)[45]] techniques.

While the aforementioned embodiments relate to nanoparticle films, it is to be understood that the transparent porous matrix may comprise a wide range of structures, provided that the pore size is sufficiently small to substantially minimize the effects of optical scattering (e.g. Rayleigh scattering) over the spectral region of interest. In one embodiment, the porous matrix is a porous glass with a mean pore size of less than about 20 nm for use in the visible spectrum. Suitable transparent porous matrix materials may be fabricated according to a wide range of methods, including polymerization reactions involving a porogen, a vapor deposition methods involving a porogen, as disclosed in U.S. Pat. No. 7,169,715, which is incorporated herein by reference in its entirety.

The transparent conductive material deposited into the nanoporous matrix is preferably a transparent conductive oxide, such as, but not limited to, ITO and ZnO. It is to be understood that materials that are generally considered to be opaque may be employed as a transparent conductive material in selected embodiments, provided that the thickness of the transparent conductive material deposited onto the pores, and/or the overall thickness of the nanocomposite, are sufficiently thin. Additional materials suitable as a transparent conductive material for internally coating the nanoporous matrix include, but are not limited to, metallic films that are sufficiently thin exhibit transparency, semiconductors, doped semiconductors, doped carbon films, and organic transparent conducting films.

Alternatively, the nanoporous matrix may be internally coated with a polymer that is compatible with a vapor deposition step. A non-limiting example of such a polymer is poly(3,4-ethylenedioxythiophene) (PEDOT), a transparent conducting polymer, which may be deposited by chemical vapour deposition, as taught in U.S. Pat. No. 7,618,680, which is incorporated herein by reference in its entirety.

Transparent conductive porous nanocomposites formed according to the methods described above may exhibit high transparency (>90% in the optical spectral region) and conductivity (within two orders of magnitude of sputtered ITO). As shown in the Examples below, nanocomposites may be fabricated at relatively low temperatures, for example, at 150° C. or lower, while retaining suitable electrical properties. Furthermore, the nanocomposites disclosed herein do not require the deposition of a transparent conductive oxide film to be used in a subsequent electrodepositing process or the initial formation of a set of seed posts.

In one embodiment, a conductive porous nanocomposite bilayer is formed by depositing a substantially solid layer of a transparent conductive material onto a transparent conductive porous nanocomposite layer. The transparent conductive material is preferably the same transparent conductive material employed to internally coat the pores of the nanoporous matrix. More preferably, both transparent conductive materials are transparent conductive oxides, such as ITO. By coating the porous nanocomposite with a transparent conductive material, a bilayer is formed in which the effective refractive index of the nanocomposite layer is substantially different than the refractive index of the substantially solid layer.

In one embodiment, a conducting polymer may be employed to form the substantially solid layer of the nanocomposite bilayer. For example, in a non-limiting embodiment, a controlled amount of ITO (e.g. 5 nm) may be deposited onto and into a (e.g. 100 nm thick) silica nanoparticle film to make it conductive. A bilayer may subsequently be formed by depositing a layer (e.g.100 nm thick) of a transparent conducting polymer on top of this film in order to form a bilayer The transparent conductive layer forming the substantially solid layer of the bilayer may comprise a thin film of an absorptive material. For example, an approximately 10 nm thick silver (Ag) film or an approximately 40 nm thick amorphous silicon (a-Si:H) film are sufficiently transparent to serve as the substantially solid layer, while enabling substantial transparency of the bilayer.

In another embodiment, a bilayer may be formed by coating a first porous nanocomposite layer with a second porous nanocomposite layer, where the composition of the first layer is different from that of the second layer. Preferably, the composition is sufficiently different to produce a significant difference in the effective refractive indices of the two layers. The composition may be varied, for example, by selecting different materials for the nanoporous matrix and/or transparent conductive material, by controlling the pore size and/or filling factor of the nanoporous matrices of each layer, and/or by controlling the volume fraction of the transparent conductive material infiltrated into each layer.

A multilayer porous nanocomposite structure is formed by depositing two or more bilayers. Preferably, the multilayer structure is periodic, thus forming a 1D photonic crystal. Accordingly, transparent and conductive porous nanocomposite bilayers may be combined to fabricate a photonic crystal that is conductive and is fabricated from materials that are optically transparent over a defined spectral range. The defined spectral range preferably comprises at least a portion of the visible spectrum.

As described further in the Examples provided below, Bragg reflectors according to the aforementioned photonic crystal embodiment have been fabricated from both silica ($SiO_2$) and antimony tin oxide (ATO) nanoparticle films and indium tin oxide (ITO) films. Bragg-reflectors were fabricated by alternately spin-coating $SiO_2$ or ATO nanoparticle films and subsequently sputtering solid ITO films onto them.

For example, to form a single bi-layer within the Bragg-reflector, ATO or $SiO_2$ nanoparticle films were first spin-coated onto an appropriate substrate and solid ITO films were subsequently sputtered onto these nanoparticle films. Using this procedure, any number of bilayers can be successively deposited in order to build up the Bragg-reflector to a desired thickness. This new class of material, which in the first instance is fabricated out of ITO and either ATO or $SiO_2$ nanoparticle films as illustrated here, can in general be fabricated out of a range of materials with appropriate base optical and electrical properties A similar structure to the photonic crystal embodiments described above may be fabricated on a patterned surface in order to render the Bragg-reflector a three-dimensional photonic crystal. A structure similar to that stated above could be fabricated wherein a two-dimensional array of holes is etched through the structure, for example, using electron beam lithography, in order to render the photonic crystal three-dimensional. Nanocomposite structures could also be produced wherein each layer within the photonic crystal is porous such that the structure supports a continuous network of pores. Furthermore, nanocomposite structures could be produced wherein the periodicity of the photonic crystal has been purposely altered at specified locations in order to create defect states within the photonic crystal.

Transparent conductive porous nanocomposite materials as described herein have great potential to enhance the performance of optoelectronic devices that are limited by charge-transport through porous nanostructures. Specific examples of such devices include dye-sensitized-solar cells and photocatalytic water-splitting devices.

In one embodiment, a photocatalytic water-splitting device comprises a nanoscale composite system where a noble metal co-catalyst and/or a narrow-bandgap semiconductor is coupled to a wide band-gap semiconductor in order to enhance the overall water-splitting reaction rate. Hydrogen fuel produced via photocatalytic water-splitting is a clean, renewable energy source. In this reaction titania ($TiO_2$) is an attractive photocatalyst because it is highly photostable, cheap, non-toxic and its chemistry has been thoroughly studied. However, the loss mechanisms preventing $TiO_2$ photocatalytic water-splitting from being an economical power source are electron-hole pair (EHP) recombination, the backwards reaction wherein $H_2$ reacts with $O_2$ to form water and the poor activation of $TiO_2$ by visible light. In the literature, photocatalysts are made of $TiO_2$ nanoparticle or nanowires to reduce EHP recombination.[25, 26] Also, nanostructured $TiO_2$ photocatalysts are loaded with noble metals to prevent the backwards reaction and can be activated by visible light through coupling with another semiconductor (S/C) that has a smaller band-gap.

To date, nanostructured $TiO_2$ composite semiconductor-photocatalytic films loaded with noble metal co-catalysts have been prepared using electrochemical, sol-gel, and photodeposition methods. Alternatively, these nanostructured $TiO_2$ composite photocatalyts could be fabricated using the methods disclosed herein. That is, for example, nanostructured $TiO_2$ photocatalytic films could be infiltrated with small and controlled amounts of noble metals and/or narrower band-gap semiconductors via vacuum-based deposition techniques. Water-splitting cells based on these photocatalytic films prepared in this manner can be expected to outperform existing devices because there will be minimal impurities at the interfaces within the composite semiconductorand at the interfaces between the nanostructured $TiO_2$ and the noble metal co-catalysts. Furthermore, the morphology of the noble-metal co-catalysts and narrow band-gap semiconductors deposited in vacuum will conform to that of the nanostructured $TiO_2$, thereby providing intimate contact between the catalysts and co-catalysts.

Other possible applications for transparent conductive porous nanocomposites disclosed herein may include enhanced LEDs, capacitors, lasers, biomedical devices, sensors, and optical communication devices. Given the tuneability of optical and electrical properties of the new class of material, in general the material can be integrated to enhance the opto-electronic performance of a wide range of electro-optic devices.

In a preferred embodiment, a transparent conductive nanocomposite photonic crystal is utilized as an intermediate reflector in a multi-junction photovoltaic device. In functioning as an intermediate reflector, a suitable conducting transparent photonic crystal will advantageously split the incident solar irradiance by reflecting higher energy photons into the upper cell while transmitting photons of relatively lower energy into the bottom cell for the case of multi-junction photovoltaic devices. As shown in the Examples below, one-dimensional modeling indicates that the introduction of a photonic crystal intermediate reflector into a micromorph cell can potentially result in cell performance gains of 18% compared gains of just 8% for state of the art intermediate reflectors that are presently used in commercially available micromorph cells.

The following non-limiting example illustrates the integration of a transparent conductive nanocomposite photonic crystal in a two-terminal tandem cell comprised of an upper a-Si:H cell and a bottom microcrystalline silicon (μc-Si:H) cell, namely the "micromorph" cell.

Figure 9:
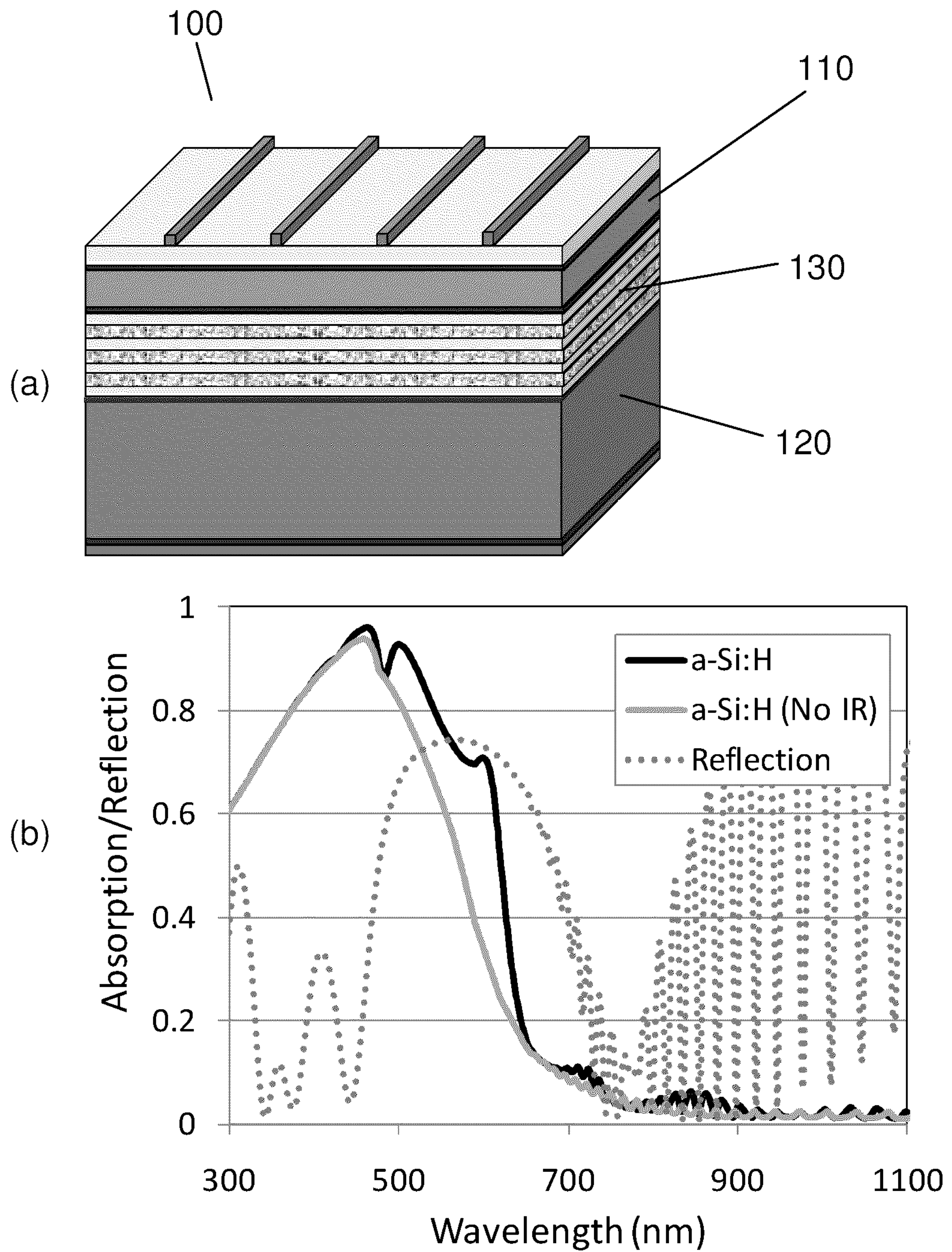
FIG. 9 shows (a) a perspective view of a micromorph tandem cell featuring an intermediate 1D photonic crystal showing the different layers and (b) absorption spectra for an a-Si:H cell in the micromorph cell without an intermediate reflector and with a photonic crystal functioning as the intermediate reflector.

Referring to FIG. 9(*a*), the micromorph[30] cell 100 comprises an upper (top) a-Si:H cell 110 and an underlying (bottom) μc-Si:H cell 120. Besides being based entirely on silicon, which is non-toxic and also the most abundant thin-film solar cell material available in the earth's crust,[31] the micromorph structure also benefits from reduced thermalization losses. In fact, the respective band-gaps of a-Si:H and μc-Si:H are approximately 1.7 eV and 1.1 eV, which is nearly optimal for minimizing thermalization losses in a dual-junction tandem cell operating under the AM 1.5 solar irradiance.[32]

Furthermore, the a-Si:H and μc-Si:H cells within the micromorph are connected in series such that the output voltage of the micromorph is the sum of its two individual component cells. However, one disadvantage of this series connection is that micromorph cells are top-limited, that is their output is limited by the relatively lower current density generated in the top a-Si:H cell as compared to the higher current density generated by the bottom μc-Si:H based cell. Thus, the first step towards enhancing the efficiency of the micromorph cell is to increase the number of photons absorbed in the upper a-Si:H cell in order to boost its generated current density. In order to achieve this, one may be inclined to simply increase the thickness of the upper a-Si:H cell. However, the thickness of a-Si:H cells must be kept to a minimum in order to mitigate the effects of light induced degradation by means of the Staebler-Wronski effect,[33] and to ensure a large internal electric field.[34] Alternatively, enhanced light trapping schemes are implemented to increase photon absorption in the upper a-Si:H cell.

In a preferred embodiment, a transparent conductive nanocomposite photonic crystal according to the aforementioned embodiments is integrated into the tandem solar cell as an intermediate reflector. The nanocomposite photonic crystal 130, formed from multiple transparent conductive nanocomposite bilayers as described above, is provided with a photonic band gap that selectively reflects a portion of the spectrum into the upper a-Si:H cell 110, where the reflected spectral portion is absorbed for conversion. The photonic crystal selectively transmits light that is absorbed by the lower a-Si:H cell 120.

In another embodiment, nanocomposite photonic crystals according to aforementioned embodiments are employed in building integrated photovoltaics (BIPV) systems. BIPV refers to photovoltaic panels used to replace building materials such as rooftops, skylights and facades. The BIPV panels function to convert a portion of the solar irradiance into electricity while transmitting the remaining portion of the solar irradiance into the building to provide lighting or to be used as a heat source. Rooftops may also support PV/T panels whereby the transmitted solar irradiance is used to heat water or air supplied to the building.

More specifically, a photovoltaic-thermal (PV/T) system comprises photovoltaic (PV) cells effectively overlayed on a solar thermal collector (STC); the PV cells convert 10-20% of the solar irradiance into electrical energy while the STC converts the remaining solar energy into thermal energy in the form of a heated fluid (air or liquid). The efficiency of STCs is reduced when integrated with PV cells owing to the cells' high emissivity and reflectivity particularly in the near infrared region.

One design strategy to alleviate these effects is to separate the PV cells and the STC with a spectrally selective intermediate layer.[43, 44] In this configuration, an ideal spectrally selective intermediate layer would 1) reflect solar irradiance of energy greater than the optical gap of the PV cells back into these cells in order to reduce their transmission losses, 2) transmit the solar irradiance of optical energy lower than the optical gap of the PV cells such that it can be absorbed by the STC, and 3) reflect the infrared radiation emitted by the STC such that it can be reabsorbed by the STC.

Figure 10:
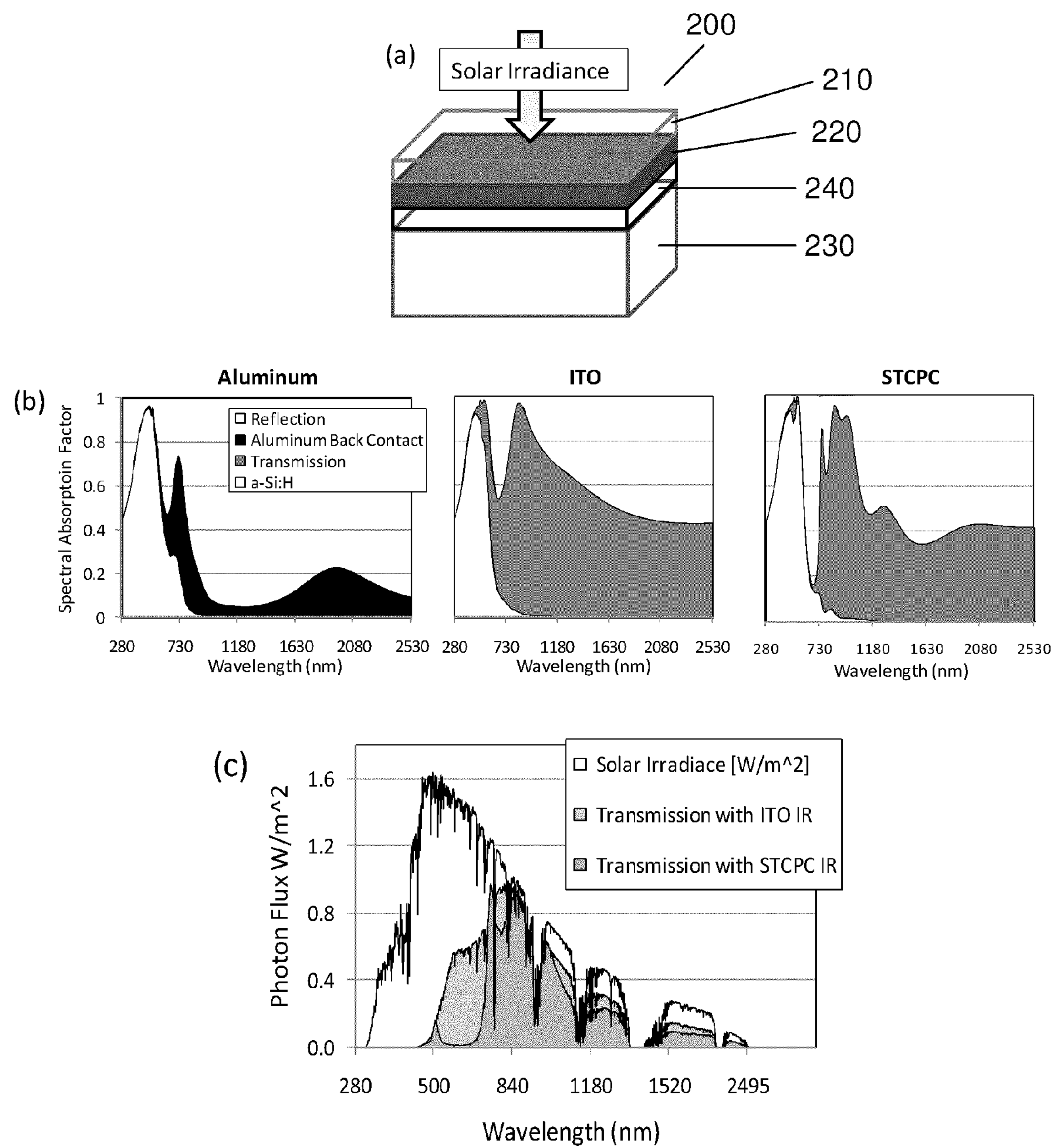
FIG. 10 shows (a) a schematic of the a-Si:H cell modeled for the application of photonic crystal intermediate reflectors in PV/T and BIPV systems; (b) a plot of the spectral absorption factor showing the portion of the solar irradiance that is either reflected, transmitted or absorbed by an a-Si:H cell with a photonic crystal back-reflector; and (c) a comparison of the solar photon flux transmitted through a-Si:H cells with photonic crystal back-contacts similar to a-Si:H cells that utilize conventional materials as their back-contact.

FIG. 10(*a*) illustrates an exemplary yet non-limiting embodiment in which a nanocomposite photonic crystal according to aforementioned embodiments is provided as an intermediate reflector for improving the performance of a BIPV and/or STC device 200. The device includes a top transparent conductive electrode 210, a photovoltaic cell 220, and a transparent substrate 230. Photonic crystal intermediate reflector 240 electrically contacts photovoltaic cell 220 (thereby acting as an electrode for the photovoltaic cell 220) and selectively reflects light having a wavelength that is absorbed by the photovoltaic cell 220. Photonic crystal intermediate reflector 240 selectively transmits light that is not substantially absorbed by photovoltaic cell 220. Transmitted light propagates into transparent substrate 230, and subsequently into a building interior or a STC.

In another embodiment, a transparent conductive nanocomposite photonic crystal is employed as linewidth narrowing electrode in a light emitting diode. The role of a microcavity in an organic light-emitting diode (OLED) system is to reorganize the available photon density of states available to the electroluminescent emitter. The effect of this reorganization, according to Fermi's golden rule, is a modification of the spontaneous emission properties of the EL emitter. For a resonant cavity, i.e. for a cavity with a cavity mode overlapping the emission of the EL emitter, the modification of the spontaneous emission can lead to a change in the spectral linewidth, a directional enhancement of emission and a small change in spontaneous emission lifetime. The resonance effect causes a large increase in the spectral power density at the resonance wavelength. As a result, the intensity of the spontaneous emission is enhanced. Therefore, the narrowing in the spectral linewidth, the increasing in the efficiency and the emissive light intensity are expected.

Figure 12:
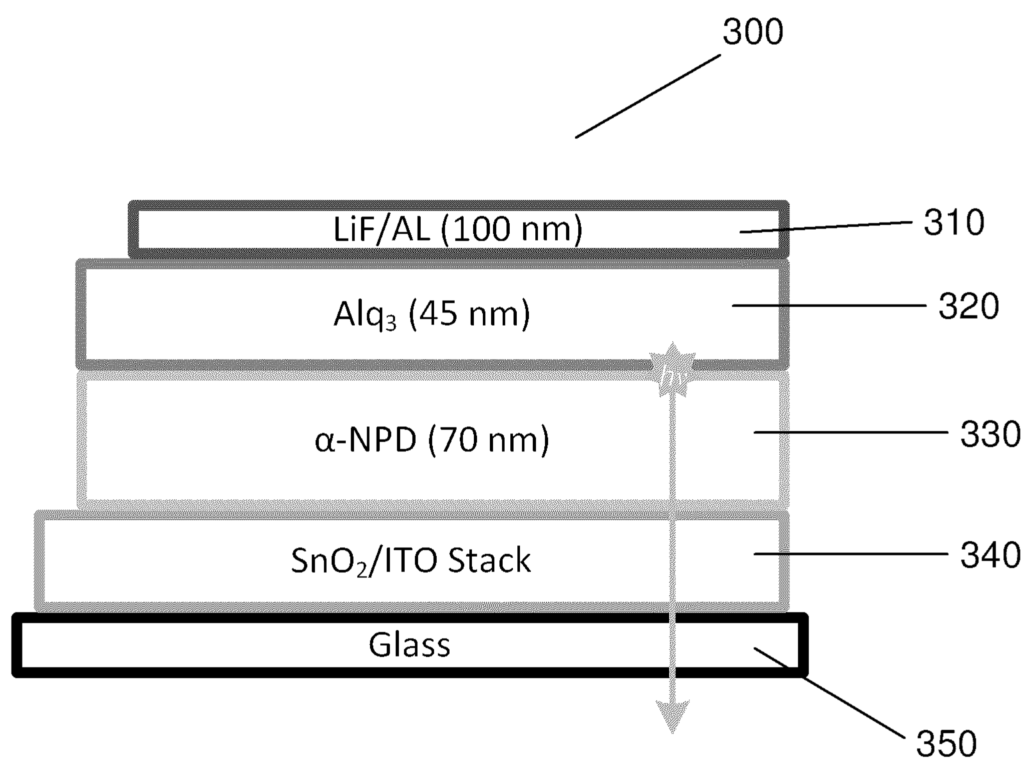
FIG. 12 shows a schematic cross sectional diagram of the OLED structure incorporating the selectively transparent and conducting Bragg-reflector of the present invention.

FIG. 12 illustrates an embodiment in which a LED anode is replaced with a transparent conductive nanocomposite photonic crystal comprising $SnO_2$ nanoparticle and sputtered ITO films, as further described below in Example 8. In this structure, an emission layer is deposited onto this nanocomposite photonic crystal and a thin metallic layer is subsequently deposited onto this emission layer. The nanocomposite photonic crystal and the metallic layer function as both reflective layers and electrical contacts, furthermore, these layers provide the boundaries of the optical microcavity. The emission layer resides within this optical microcavity.

The following examples are presented to enable those skilled in the art to understand and to practice the present invention. They should not be considered as a limitation on the scope of the invention, but merely as being illustrative and representative thereof.

EXAMPLES

Example 1

Fabrication of Transparent Conductive Nanocomposites, Bilayers and Photonic Crystals In order to fabricate mesoporous transparent and conducting films an approximately 100 nm thick nanoparticle film was first prepared from a solution of $SiO_2$ nanoparticles, purchased from Aldrich (Ludox SM-30, 30 wt %) that is diluted in deionised water (3:1 deionized water/Ludox). This solution is subsequently filtered through a 0.2 μm pore Nylon syringe filter before being spin-coated onto a 0.7 mm thick ~2.5 cm×2.5 cm Corning 1737 glass substrate at speed of 3000 rpm for 20 seconds. The $SiO_2$ nanoparticle films are then annealed at 450° C. for 15 minutes in order to evaporate any remaining solvent. Subsequently, small and controlled amounts of ITO are deposited onto the $SiO_2$ nanoparticle films in a custom built sputtering system (Kurt J. Lesker Co.) by RF magnetron sputtering from a ceramic $In_2O_3$:$SnO_2$ target (90:10 wt %).

During the deposition, argon was flowed into the chamber at a rate of 20 sccm after the base pressure of the sputtering chamber had been pumped down to $1\times10^{-7}$ Torr. The chamber pressure was set to 3 mTorr and the deposition was carried out at room temperature. The substrate-to-target distance was approximately 14 cm and the film growth rate was $4\times10^{-2}$ nm/s. The sputtering process was terminated when the desired thickness, as measured from an in situ thickness monitor (SQM-242 from Sigma), had been deposited.

The fabrication of 1D photonic crystals comprising antimony-tin-oxide (ATO) nanoparticle films was initiated by sputtering an ITO film onto a glass substrate. The deposition conditions used to sputter the ITO are similar to those used to deposit the ITO for the transparent and conducting mesoporous thin-films described above. A solution of ATO nanoparticles (50 wt % (solid content)) in water, purchased from Alfa-Aesar (Nanotek), was used to deposit the ATO nanoparticle films. The dispersion was first diluted under vigorous stirring with water causing some aggregation and subsequent flocculation. The aggregates were then removed by centrifugation (6000 rpm for 12 min). Subsequently, the dispersion was filtered through a 0.45 μm pore Nylon syringe filter and the resulting dispersion was spin coated onto the previously sputtered ITO film at a speed of 2000 rpm for 20 s. The thicknesses of the resulting ATO nanoparticle films, when deposited onto a flat substrate, were about 70 nm thick but do show some variation. As a final step, the film was annealed for 15 minutes at a temperature of 500° C. in order to dry out any remaining solvents.

The aforementioned sputtering and spinning procedures are repeated in order to build up the various layers in the Bragg reflector. In order to maximize Bragg reflection, the final layer deposited onto the reflector is sputtered ITO rather than the ATO nanoparticle film; the ITO film has the larger index of refraction and therefore provides a more reflective surface.

Figure 2:
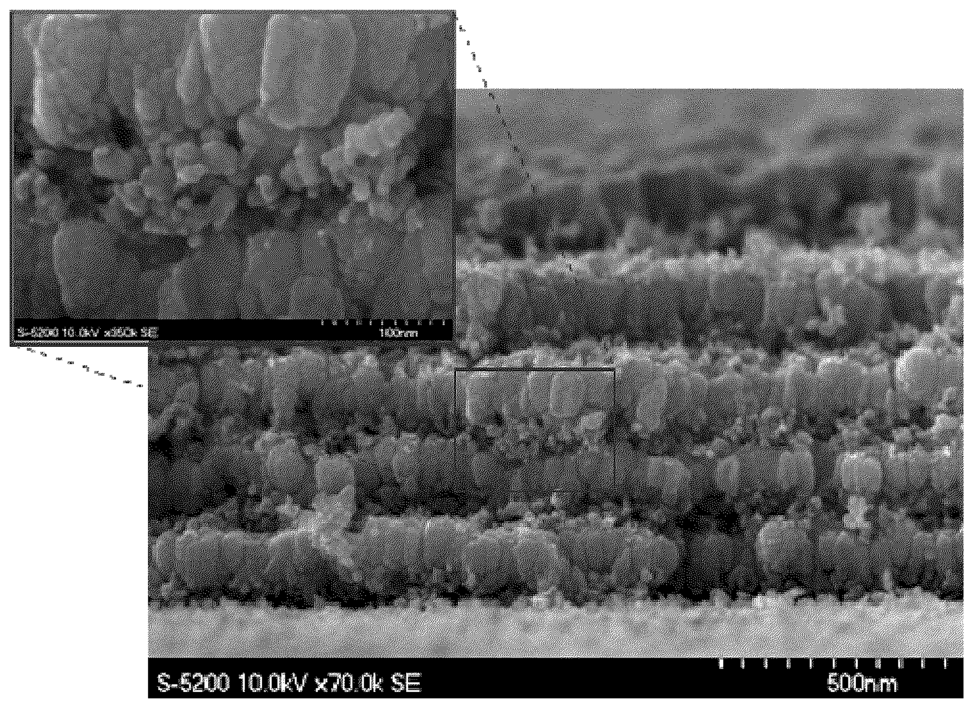
FIG. 2 is a cross-sectional SEM image of a 1D photonic crystal comprised of five and a half bilayers of sputtered ITO and spin-coated ATO nanoparticle films, the inset shows a highly magnified image of a layer of smaller ATO nanoparticles sandwiched between two sputtered ITO films.

For this proof of concept experiment, films having three and a half (3.5 bi-layers) to seven and a half (7.5 bi-layers) were fabricated. A cross-sectional SEM image of a 1D photonic crystal comprised of five and a half alternating layers of sputtered ITO and spin-coated ATO films is shown in FIG. 2(*a*). Also, the reflection and transmission spectra for similar 1D photonic crystals having 3.5 to 7.5 bilayers are shown in FIGS. 2(*b*) and 2(*c*), respectively.

The fabrication of the 1D photonic crystals comprising the $SiO_2$ nanoparticle films was initiated by spin-coating the nanoparticle films onto an appropriate substrate such as Corning 1737 glass or a polished silicon wafer. The procedure used to fabricate the $SiO_2$ nanoparticle films is similar to that described above.

Example 2

Morphology, Optical Transmission and Reflection Spectra of Multilayer Nanocomposite Films and Photonic Crystals Experiments were performed for which either about 5 nm, or 10 nm of ITO was sputtered onto the $SiO_2$ nanoparticle films (that is, if the ITO had been sputtered onto a flat substrate the thickness of the film would be approximately 5 nm or 10 nm thick, respectively). This process, wherein a $SiO_2$ nanoparticle film is deposited and subsequently controlled amounts of ITO are sputtered onto the film can be successively repeated in order to build up a film of desired thickness.

The transmission and sheet resistance of $SiO_2$ nanoparticle films fabricated by performing the aforementioned procedure one, three and five times are shown in FIG. 1. It is interesting to note that the transmission through the Corning 1737 glass substrates that had the nanoparticle films deposited onto them is actually greater than the bare glass substrates. This is because the index of refraction of the nanoporous transparent and conducting films is less than that of the glass substrate and the nanoparticle films acts as an anti-reflection coating. Some of the samples, especially those formed from 5 layers, exhibited a dip in the transmission spectra at about 400 nm. This dip is resultant of a weak Bragg reflectance peak attributed to the thin layers of ITO residing on top of each $SiO_2$ nanoparticle film.

Figure 3:
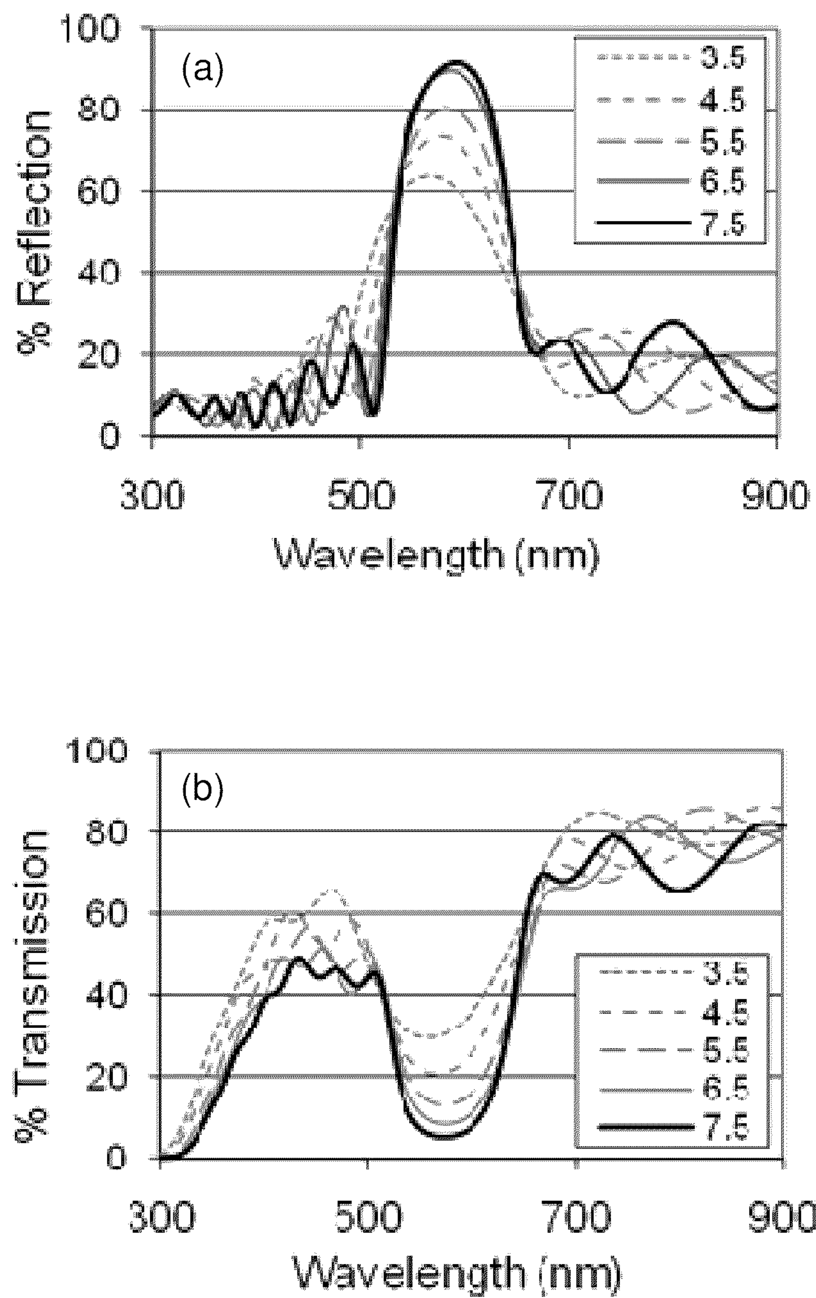
FIG. 3 shows (a) reflectance and (b) transmittance from a set of 1D photonic crystals, similar to that shown in FIG. 1(*a*), but with a differing number of bilayers as indicated in the legend.

FIG. 3 shows the results from optical measurements performed on ATO composite films. The spectral position of the reflectance peaks of 1D photonic crystals can be set by appropriately tuning the thickness of their layers. This is demonstrated in FIG. 3, which shows the reflectance spectra of three 1D photonic crystals comprised of 5.5 bilayers of about 80 nm thick ATO nanoparticle films and ITO layers that have equivalent thicknesses of about 60 nm, 80 nm and 100 nm when deposited onto a flat substrate. The reflectance spectra of these 1D photonic crystals comprising the 60 nm, 80 nm and 100 nm thick ITO layers peak at about 520 nm, 580 nm and 670 nm, and thus appear green, yellow and red in color, respectively. A photograph of each of the green, yellow and red 1D photonic crystals are included in FIG. 3 as an inset above their corresponding reflectance spectra.

Figure 6:
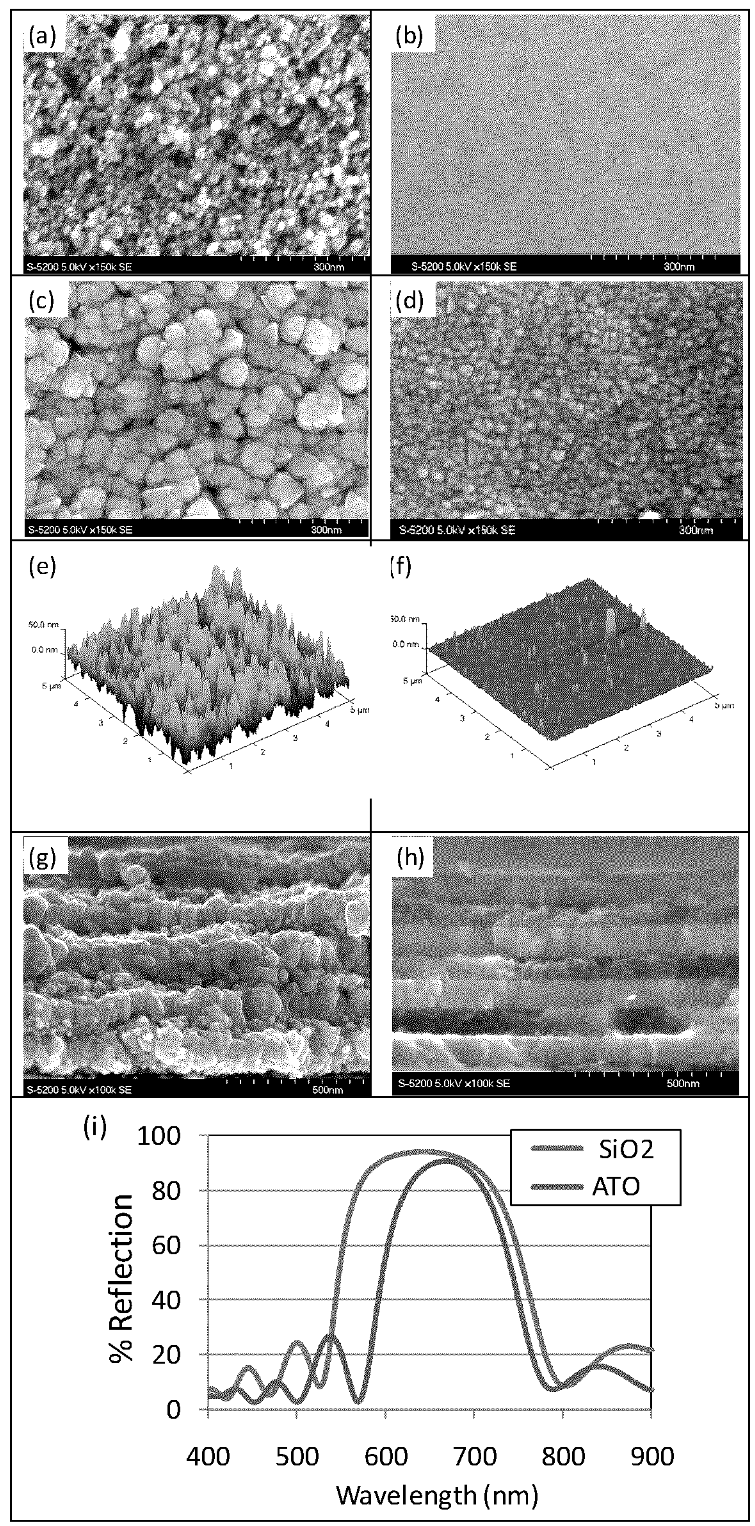
FIGS. 6(*a*) through (*h*) show a series of SEM images and atomic force microscopy images that compare 1D photonic crystals made with either ATO or $SiO_2$ nanoparticles. The reflectance of these two types of 1D photonic crystals are compared in FIG. 6(*i*).

FIG. 6 shows top-view SEM images of nanoparticle films spin-coated from ATO nanoparticles (a) which are less compact than those prepared from $SiO_2$ nanoparticles (b). Top-view SEM images also show that approximately 100 nm thick ITO films sputtered on top of the ATO nanoparticle films (c) are less compact than ITO films deposited onto $SiO_2$ nanoparticle films (d). Moreover, AFM images of photonic crystals comprised of ATO nanoparticle films with an average surface roughness of 16.6 nm (e), and $SiO_2$ nanoparticle films with an average roughness of 3.14 nm (f), reinforce these results. Furthermore, cross-sectional SEM images show that the interfaces between the layers in the photonic crystals comprising the ATO nanoparticle films (g) are difficult to distinguish while the interfaces within the photonic crystals comprising the silica nanoparticle films (h) are well-defined.

These well-defined interfaces in the photonic crystals with the $SiO_2$ nanoparticles improve their performance, in terms of the width and intensity of their Bragg-reflection peaks in comparison with the photonic crystals with the ATO nanoparticle films. For instance, the reflectance spectra (red line) of a photonic crystal with 5.5 bilayers of 100 nm thick sputtered ITO and ATO nanoparticle films (i), wherein the upper- and bottom-most layers are ITO, has a peak value of 91% and a full width at half maximum of 160 nm. In comparison, the reflectance spectra of a photonic crystal with 5 bilayers of 100 nm thick sputtered ITO and $SiO_2$ nanoparticle films has a peak value of 94% and a full width at half maximum of 210 nm. The photonic crystals with the $SiO_2$ nanoparticle films outperform those with the ATO nanoparticle films because the average diameter of the $SiO_2$ nanoparticles is smaller (approximately 10 nm as compared to about 15 to 20 nm) and also because the morphology of the two dispersions is different. That is, the $SiO_2$ nanoparticles are nearly spherical and are more monodisperse than the irregularly shaped ATO nanoparticles. Consequently, the $SiO_2$ nanoparticle films are more compact.

Ellipsometric porosimetry measurements showed that the porosity of the silica nanoparticle films was ~28% and that of the ATO nanoparticle films was ~41%. The more compact $SiO_2$ nanoparticle films thus provide well-defined interfaces and a greater refractive index contrast between the alternating layers within the photonic crystal. That is, ITO films sputtered onto the irregularly shaped ATO nanoparticle films show some degree of porosity, and a comparatively smaller refractive index, while sputtering onto the $SiO_2$ nanoparticle films yields solid ITO films (see FIG. 6). FIG. 6 therefore shows that some degree of control over the porosity, reflectance and transmittance of the photonic crystals may be obtained through appropriate choice of the size, morphology and monodispersity of the nanoparticle dispersion used to fabricate the nanoparticle films.

Example 3

Conductivity of Multilayer Nanocomposite Films

Conductivity measurements were obtained by depositing two rectangular co-planar aluminum contacts (0.25 cm×0.5 cm), spaced apart by 400 μm, 700 μm, or 1 mm, onto each sample. The current through the films was measured, using a Keithley 6517 electrometer, as different biases were applied across the pair of contacts. The resistivity values are calculated from the sheet resistance measurements using the formula $Rs=\rho/t$. Where t is the thickness of the photonic crystal and is estimated from the cross-sectional SEM images.

Referring again to FIG. 1, the resistivity of the silica nanoparticle films that underwent about 5 nm and 10 nm of ITO sputtering is approximately $3\times10^{-1}$ and $3\times10^{-2}$ Ω·cm, respectively. In comparison, the resistivity of an ITO film deposited using the same conditions is about $5\times10^{-4}$ Ω·cm. Also, it can be noted that the resistivity of a $SiO_2$ nanoparticle film that has not been subjected to ITO sputtering was measured to be on the order of $1\times10^{12}$ Ω·cm. Next, it is disclosed how these mesoporous transparent and conducting films can be used as "building blocks" to fabricate photonic crystals.

Figure 4:
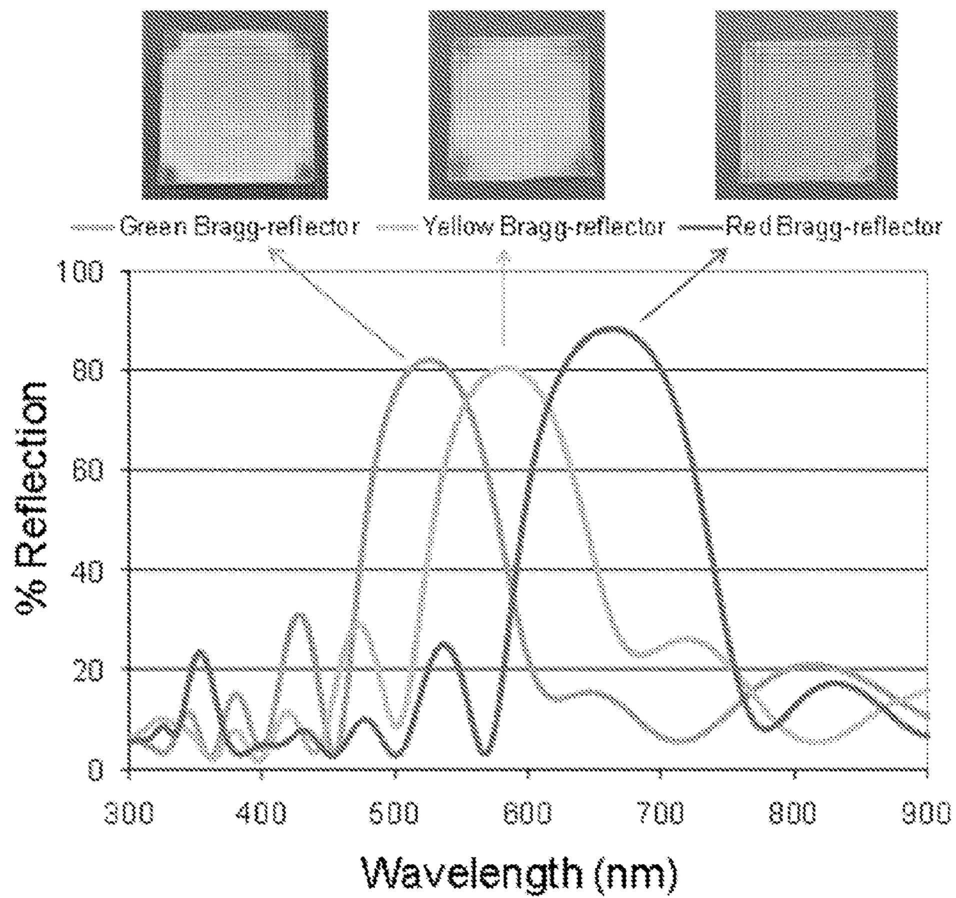
FIG. 4 shows the reflectance spectra of a green, a yellow and a red 1D photonic crystal which peak at approximately 520 nm, 580 nm and 670 nm. A photograph of each 1D photonic crystal is shown as an inset above its reflectance peak.

The conductivity dependence of the ATO 1D photonic crystals on both their number of bilayers and the thickness of their sputtered ITO layers was also investigated. Specifically, the sheet resistance of the 1D photonic crystals described in FIGS. 2 and 3 were measured using a four point probe (Four dimensions, Inc. Model 101C) and the results from the 1D photonic crystals containing 3.5, 5.5 or 7.5 bilayers are plotted in FIG. 4. The sheet resistances of the green, yellow and red 1D photonic crystals shown in FIG. 4 are also plotted in FIG. 5. The sheet resistance of these two sets of 1D photonic crystals, measured before and after undergoing a 16 hr annealing treatment in air at 500° C., are plotted alongside the sheet resistance measured from two individual ~80 nm thick ATO nanoparticle and sputtered ITO films.

Figure 5:
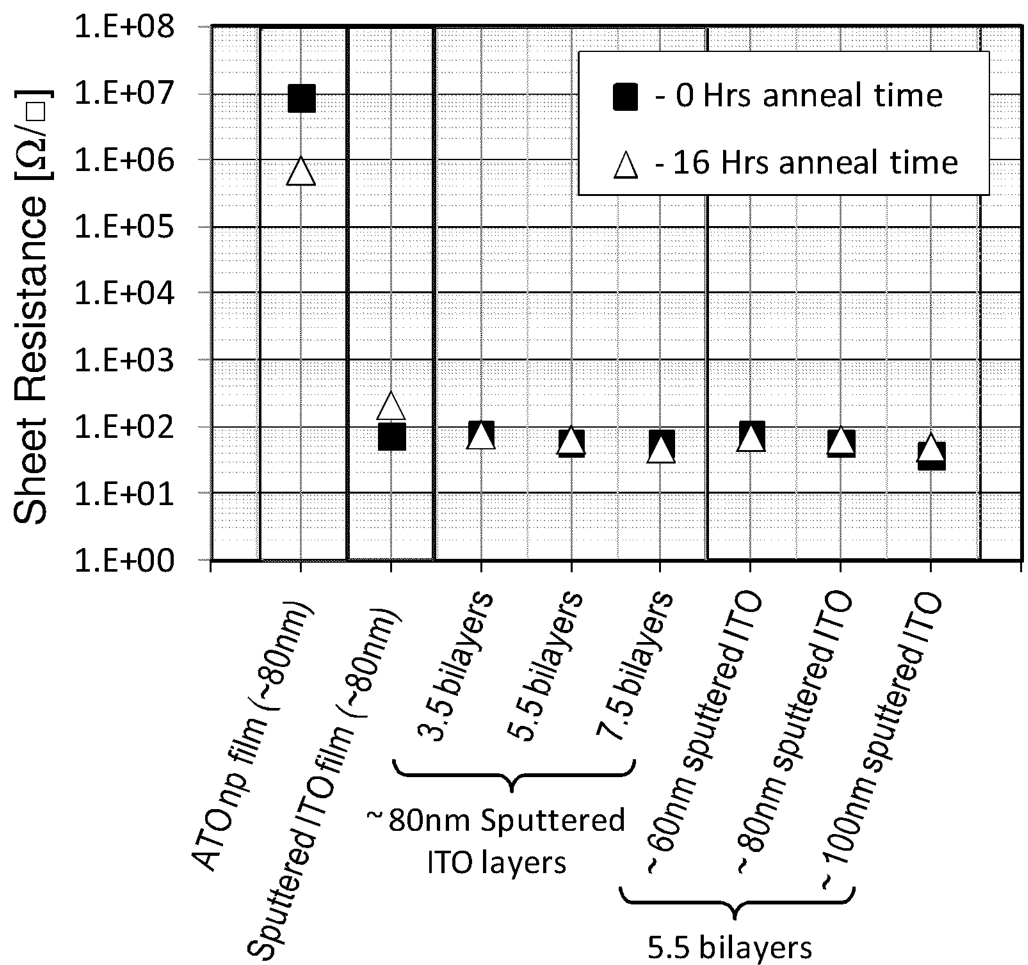
FIG. 5 shows the sheet resistance of various 1D photonic crystals plotted alongside that of certain reference films.

Referring to the first two columns of FIG. 5, the annealing treatment decreases the sheet resistance of the ATO nanoparticle reference film from $8.5\times10^6$ to $6.8\times10^5$ Ω/□, but increases that of the ITO reference film from 70 to 210 Ω/□. Sintering nanoparticle films is known to increase their conductivity, and ATO nanoparticle films of comparable thickness to those in the stacks exhibiting sheet resistances on the order of $10^4$ Ω/□ have been fabricated.[27,28] Furthermore, ITO films are typically subjected to post-deposition annealing treatments in order to reduce their resistance, however, the resistance of ITO films have been shown to increase upon annealing in air at temperatures above 300° C.[29]

The sheet resistance of the first set of 1D photonic crystals comprising 3.5, 5.5 and 7.5 bilayers, are plotted in columns 3 through 6 of FIG. 5, and were 78.6, 56.5 and 54.7 Ω/□, respectively. These values are comparable to the 70 Ω/□ measured for the single 80 nm thick sputtered ITO reference film. Furthermore, the annealing process did not significantly change the sheet resistance of these 1D photonic crystals as all values measured after the annealing process are within 20% of those measured beforehand.

The sheet resistance of the green, yellow and red 1D photonic crystals photographed in FIG. 4 are plotted in columns 6 through 8 of FIG. 5, and are 74.4, 56.5 and 35.9 Ω/□, respectively. Once again, the sheet resistance of the 1D photonic crystals measured before and after the annealing treatment are within 20% of each other with the exception of the 1D photonic crystal containing the 100 nm thick ITO layers, which increased from 35.9 to 49.7 Ω/□. As a final comment, the 16 hr annealing process did not significantly change the reflectance or transmittance spectra of the 1D photonic crystals.

The low sheet resistance of the photonic crystals described above distinguishes them from previously reported Bragg reflectors that have been made by alternately spin-coating nanoparticle films of different composition (see references 16-18). While fabricating the present nanocomposite photonic crystals, during the sputtering process there is a certain degree of infiltration of ITO into the pores and voids of the ATO nanoparticle film. This infiltration gives rise to a continuous network for electrical transport.

Example 4

Figure 7:
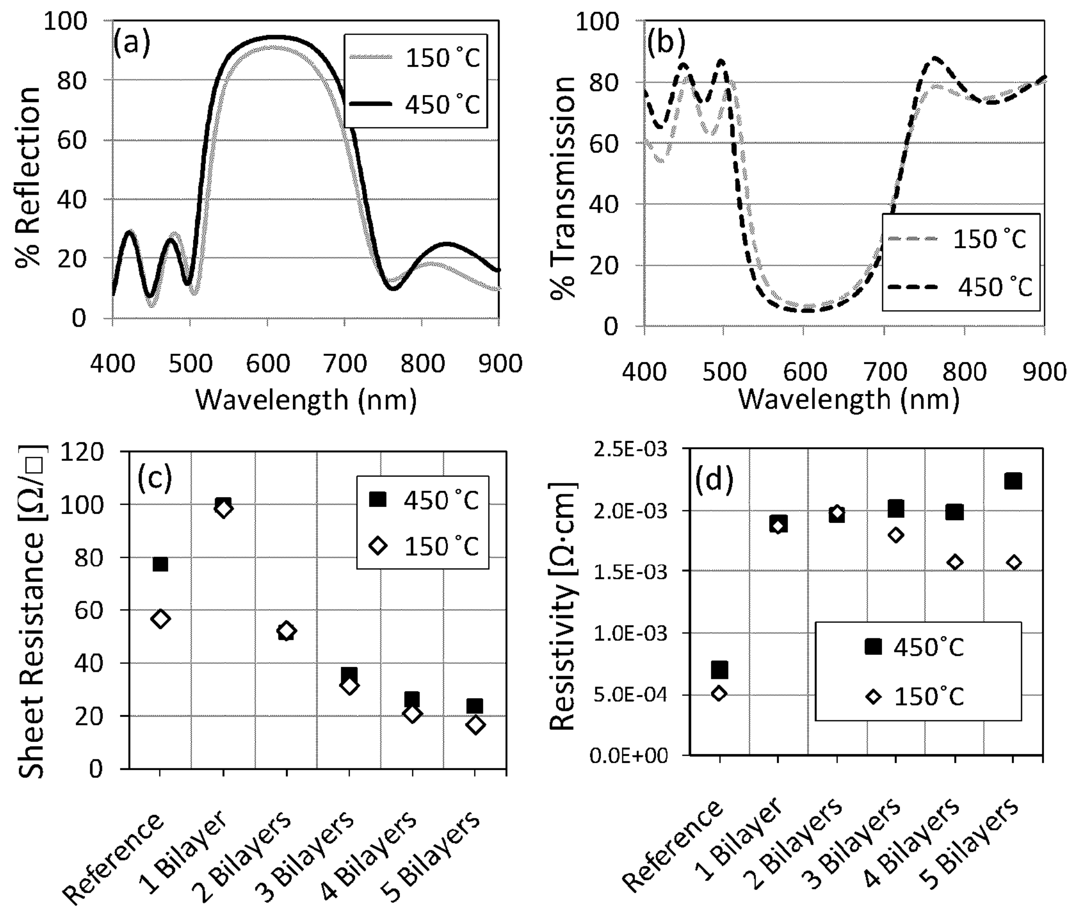
FIGS. 7(*a*) and (*b*) compare the reflectance and transmittance spectra, respectively, of photonic crystals that were fabricated at temperatures below either 150° C. or 450° C., while the sheet resistance and resistivity are shown in (c) and (d), respectively.

Effect of Thermal Processing on Optical Properties of Nanocomposite Photonic Crystals It was important to confirm that the photonic crystals can be fabricated at relatively low temperatures (preferably in the range of 150° C.) because the quality of many materials commonly used in photovoltaic and other opto-electronic devices, including hydrogenated amorphous silicon, degrades at elevated temperatures. As shown in FIGS. 7(*a*) and (*b*), the reflectance and transmittance of the 1D photonic crystals fabricated without exceeding a temperature of 150° C. are similar to those fabricated at temperatures of 450° C.

To investigate the effects of the annealing temperature on their electrical properties the sheet resistance of photonic crystals with differing numbers of bilayers annealed at either 150° C. or 450° C. were measured using a four point probe and the results are plotted in FIG. 7(*c*) and (*d*). As can be seen in the first column of FIG. 7(*c*), the sheet resistance of an ITO reference film deposited onto a glass substrate and subsequently annealed for 5 h at 450° C. is 77 Ω/□ while a similar reference film annealed at 150° C. for the same duration is 57 Ω/□.

As shown in the second column of FIG. 7(*c*), when an ITO film is deposited using similar conditions onto the porous nanoparticle film its sheet resistance is increased to 100 Ω/□. As the number of bilayers within the photonic crystals is increased its sheet resistance successively decreases to a value of 15.0 Ω/□ and 23.6 Ω/□ for photonic crystals with 5 bilayers that were annealed at 150° C. and 450° C., respectively. In comparison, the sheet resistance of photonic crystals that were 5.5 bilayers thick and fabricated using ATO nanoparticles and slightly thicker sputtered ITO films was measured to be 35.9 Ω/□.

The fact that the sheet resistance of the photonic crystals decreases as their number of layers increases is an important result because it shows that, unlike silica nanoparticle films deposited on glass, silica nanoparticle films within the photonic crystals do not function as an electrical insulator. I-V measurements indicate that the resistivity of $SiO_2$ nanoparticle films is on the order of $10^{12}$ Ω·cm (not shown). However, the average resistivity of the photonic crystals annealed at 150° C. and 450° C. are $1.8\times10^{-3}$ Ω·cm and $2.0\times10^{-3}$ Ω·cm, respectively. Furthermore, the resistivity of these photonic crystals does not depend significantly on their number of bilayers (see FIG. 7(*d*)).

If the $SiO_2$ nanoparticle films functioned as an insulator in the photonic crystals then one would expect their sheet resistance to remain constant and their resistivity to increase as their number of bilayers was increased. Also, for comparison, the resistivity of the sputtered ITO reference films annealed at 150° C. and 450° C. are $5.1\times10^{-4}$ Ω·cm and $7.0\times10^{-4}$ Ω·cm, respectively.

As noted above, it is believed that electrical current can traverse the silica nanoparticle films within the photonic crystal because there is some degree of infiltration of ITO into the voids and/or pores of the nanoparticle film during the sputtering process. Thus, it is the ITO that infiltrates the nanoparticle films and coats the nanoparticles, rather than the nanoparticles themselves, that provides a continuous electrical connection between the ITO layers within the photonic crystal.

Example 5

Nanocomposite Bilayers Involving Two Different Nanoparticle Layers

Substantially porous photonic crystals were also fabricated from two different porous materials, with corresponding differing indices of refraction. More specifically, highly transparent and conducting mesoporous films have been prepared by sputtering controlled amounts of ITO (an equivalent thickness of about 5 nm) onto $TiO_2$ nanoparticle films as well as $SiO_2$ nanoparticle films. The $SiO_2$ and $TiO_2$ nanoparticle films were spin-coated using methods similar to those previously described. By alternately depositing these $SiO_2$ and $TiO_2$ conductive mesoporous films, a substantially porous Bragg-reflector was fabricated.

Figure 8:
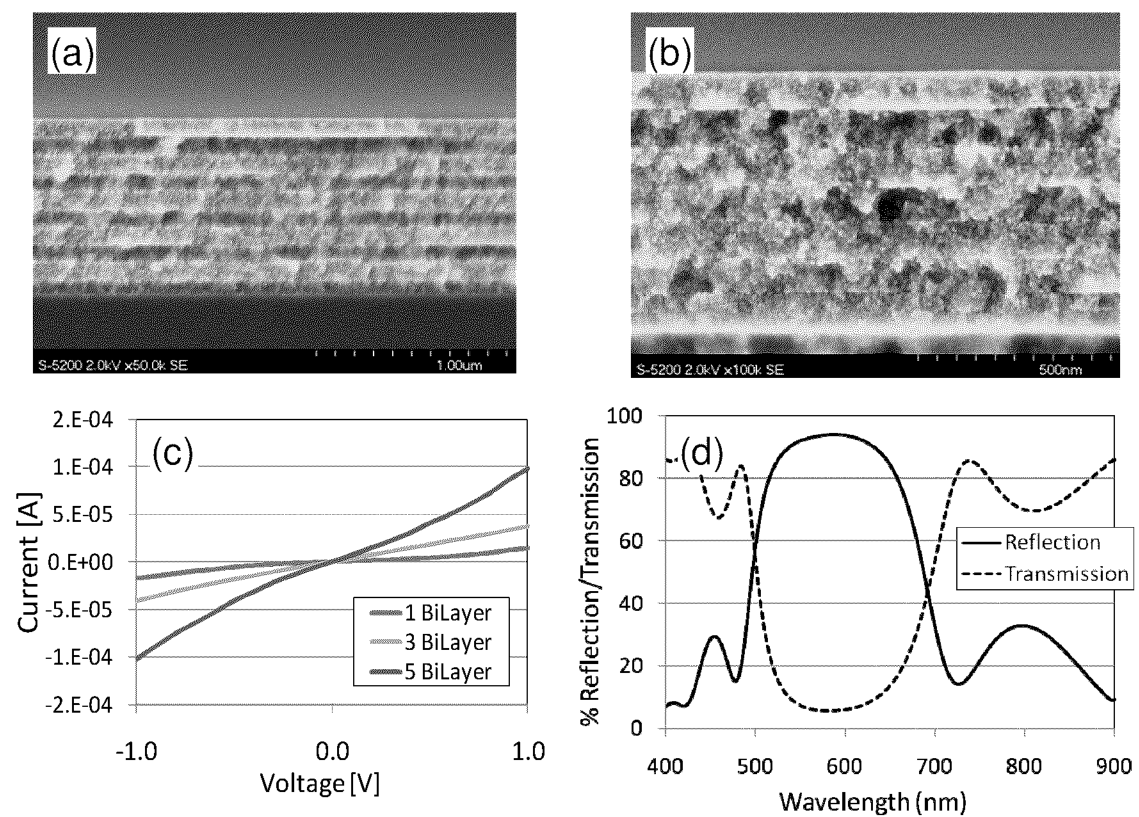
FIG. 8 shows (a) a cross-sectional SEM image of a substantially nanoporous photonic crystal comprised of five alternating bi-layers of $SiO_2$ and $TiO_2$ nanoparticle films; (b) a similar cross-sectional image to that shown in (a) but at a higher magnification; (c) I-V curves for the nanoporous photonic crystal and (d) reflection and transmission spectra of the nanoporous photonic crystal.

FIG. 8(*a*) a shows a cross-sectional SEM image of a substantially nanoporous photonic crystal comprised of five alternating bi-layers of $SiO_2$ and $TiO_2$ nanoparticle films. The top and bottom layers in the one-dimensional photonic crystal are comprised of $TiO_2$ and $SiO_2$ nanoparticles, respectively. Thus, the $TiO_2$ nanoparticle films appear brighter in the SEM image. The image shown in FIG. 8(*b*) is similar to that shown in FIG. 8(*a*) but at a higher magnification. The individual nanoparticles within the $TiO_2$ and $SiO_2$ nanoparticle films can be distinguished in FIG. 8(*b*). It can also been seen that some of the $SiO_2$ nanoparticle films have spilled over onto the $TiO_2$ films while the sample was cleaved.

FIG. 8(*c*) shows I-V curves for substantially nanoporous photonic crystals similar to that imaged in FIG. 8(*a*) but with either 1, 3 or 5 bilayers. Based on these I-V measurements, and using the cross-sectional SEM images to estimate that both the $SiO_2$ and $TiO_2$ nanoparticle films are 85 nm thick, the resistivity of the nanoporous photonic crystals with 1, 3 or 5 bilayers is determined to be 6.00 Ω·cm, 6.86 Ω·cm, and 4.32 Ω·cm, respectively. Thus, the resistivity of the nanoporous photonic crystals does not depend on the number of their bilayers, implying that a continuous electrical pathway exists throughout the entire structure.

FIG. 8(*d*) plots the reflection and transmission spectra for the substantially nanoporous photonic crystal imaged in FIG. 8(*a*). The reflection spectrum exhibits a reflection peak of 94% at a wavelength of 586 nm. Furthermore, the transmission spectrum shows that these photonic crystals are highly transmissive in the spectral regions on either side of their stop-gap.

Example 6

Simulations of Multi-Junction Photovoltaic Device with Intermediate Nanocomposite Photonic Crystal Reflector The scattering matrix method[35,36] was employed to model the performance of photonic crystal intermediate reflectors in micromorph solar cells upon exposure to the ASTM AM1.5 (Global tilt) solar spectrum.[37] A schematic diagram of the micromorph cell with an photonic crystal intermediate reflector modeled in this work is shown in FIG. 9(*a*). The details of the calculations are similar to those used in the literature.[38] In short, the scattering matrix method is implemented by dividing the structure shown in FIG. 9(*a*) into a number of uniform layers and using an infinite set of plane waves to represent the electromagnetic field within each of these layers. The method then rigorously solves Maxwell's equations throughout the structure by imposing matching conditions for the tangential field at each boundary between the layers.

The absorption in the a-Si:H and μc-Si:H cells within the micromorph are determined from the Poynting vectors calculated at the upper and lower boundaries of these cells. The current generated in each of the a-Si:H and μc-Si:H cells are then determined using the assumption that each absorbed photon generates and contributes one electron to the output current density. The model requires prior knowledge of the thickness and optical parameters, namely the index of refraction (n) and extinction coefficient (κ), for each layer in the structure. The top layer in the micromorph structure is a 60 nm thick transparent conducting oxide. This TCO is assumed to be completely non-absorbing and its index of refraction is set to 1.9 for all wavelengths of incident light. The thickness of the top a-Si:H cell is assumed to be 100 nm and its optical constants are determined from the literature.[39] The thickness of the underlying μc-Si:H cells is set to 4 μm because the electrical performance of μc-Si:H cells degrades as its thickness is increased beyond this point.[40]

The optical parameters of the μc-Si:H were determined using the effective medium approximation assuming a two-phase mixture of a-Si:H and crystalline silicon (c-Si) both having a volume fraction of 0.5.[41,42] The optical parameters of the sputtered ITO and silica nanoparticle films within the photonic crystal intermediate reflector were determined using spectroscopic ellipsometry measurements (not shown).

The current generated in the upper a-Si:H and lower μc-Si:H cells of the micromorph cell without an intermediate reflector is calculated to be 11.6 mA/cm$^2$, and 21.4 mA/cm$^2$, respectively. When a single homogeneous TCO film, with the same optical properties as that of the sputtered ITO in photonic crystals, is used as the intermediate reflector the absorption in the a-Si:H cell is increased to 12.6 mA/cm$^2$ (a relative increase of 8%) and the corresponding current in the bottom cell is 17.7 mA/cm$^2$.

However, when a photonic crystal comprised of 3.5 bilayers of sputtered ITO and silica nanoparticle films is used as the intermediate reflector the current generated in the upper a-Si:H cell is increased to 13.7 mA/cm$^2$ (a relative increase of 18%) while the corresponding current generated in the underlying μc-Si:H cell is 13.9 mA/cm$^2$. This optimal case occurs when the ITO is 75 nm thick and the silica nanoparticle film is 90 nm thick.

The absorption in the upper a-Si:H cell for the micromorph cells both with the photonic crystal intermediate reflector and without an intermediate reflector are plotted in FIG. 9(*b*). Here it can be seen that the absorption enhancements in the upper a-Si:H cell with the photonic crystal intermediate reflector are the greatest over the stop-gap frequencies of this Bragg-reflector, where its reflection is at a maximum.

Example 7

Simulations of Building Integrated Photovoltaics Device with Intermediate Nanocomposite Photonic Crystal Reflector The results presented in this example involve the use of the scattering matrix method (as described in the previous section) to model the performance of thin film silicon based photovoltaic cells that have been deposited onto glass substrates for applications in BIPV systems. The model calculates the current generated in the cell as well as portion of the solar irradiance transmitted into the glass substrate for three different cases; 1) a 2 μm thick aluminum film is used as the back-reflector 2) an ITO film is used as the back-reflector and 3) a photonic crystal is used as a back-reflector. Thus, the results from the model indicate how much electrical current is generated in the thin silicon cell and what portion of the solar irradiance will be transmitted such that it can effectively be used in BIPV or PV/T systems.

Figure 11:
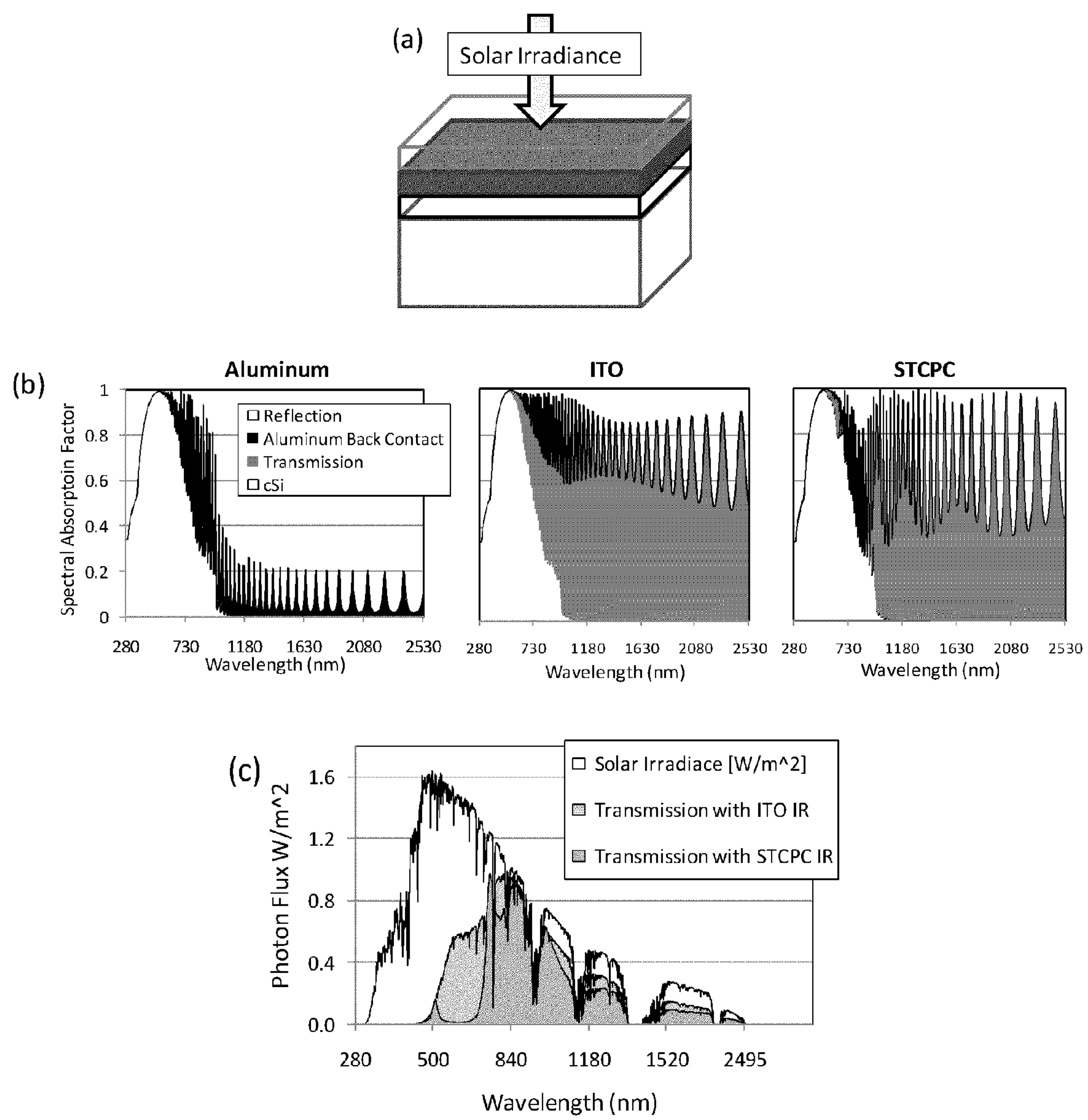
FIG. 11 shows (a) the μc-Si:H cell modeled for the application of photonic crystal intermediate reflectors in PV/T and BIPV systems; (b) a plot of the spectral absorption factor showing the portion of the solar irradiance that is either reflected, transmitted or absorbed by a μc-Si:H cell with an photonic crystal back-reflector; and (c) a comparison of the solar photon flux transmitted through μc-Si:H cells with photonic crystal back-contacts to similar μc-Si:H cells that utilize conventional materials as their back-contact.

Two different thin-film silicon based cells are considered, namely a 100 nm thick amorphous silicon (a-Si:H) cell and a 5 μm thick crystalline silicon (μc-Si) cell and the results from the scattering matrix method calculations are provided in Tables 1 and 2, respectively. Also, details about the model and results for the 100 nm thick amorphous silicon (a-Si:H) and 5 μm thick crystalline silicon (μc-Si) cells are provided in FIGS. 10 and 11, respectively.

TABLE 1

Transmitted solar power and current generated in a 100 nm thick a-Si:H cell

| | Aluminum | STCPC | ITO |
|---|---|---|---|
| Transmitted Power [W/m^2] | 0 | 306 | 452 |
| Generated Current [mA/cm^2] | 13.9 | 13.5 | 12.0 |

TABLE 2

Transmitted solar power and current generated in a 5 μm thick μc-Si cell

| | Aluminum | STCPC | ITO |
|---|---|---|---|
| Transmitted Power [W/m^2] | 0 | 183 | 317 |
| Generated Current [mA/cm^2] | 26.6 | 27.0 | 24.0 |

Referring to Table 1, it is interesting to note that the current generated in an a-Si:H cell decreases from 13.9 mA/cm$^2$ to 13.5 mA/cm$^2$ when a photonic crystal is utilized as the back reflector, however, the power transmitted through the cell is 306 W/m$^2$ whereas all of the solar irradiance is reflected when the aluminum contact is used as the reflector. For comparison, the transmitted power when ITO is used as the back-reflector is 452 W/m$^2$, however, the current generated in the a-Si:H cell in this case is decreased to 12.0 mA/cm$^2$. Here it can be noted that the total power received from the AM1.5 solar irradiance is 1000 W/m$^2$.

The results from Table 2 are especially interesting because the current generated in a 5 μm thick crystalline silicon solar cell is actually greater for the case in which a photonic crystal is utilized as the back reflector as compared to the case in which an aluminum film is used as the back reflector (27.0 mA/cm$^2$ as compared to 26.6 mA/cm$^2$). This is because the photonic crystal can be made to reflect more and absorb less light than a conventional aluminum film. Furthermore, for the case of the 5 μm thick μc-Si cell the photonic crystal transmits 183 W/m$^2$ while the aluminum back-reflector does not transmit any light. The fact that 183 W/m$^2$ are transmitted through may further improve the cell efficiency by keeping it cool since the efficiency of μc-Si cells are known to decrease with increasing temperature.

Example 8

LED Devices with Integrated Transparent Conducting Porous Nanocomposite Photonic Crystal Anodes Organic light emitting diode (OLED) microcavity systems were fabricated to demonstrate an additional application of the above embodiments. OLEDs were fabricated with a 1D transparent conductive porous nanocomposite photonic crystal forming the anode. The photonic crystal consisted of alternating layers of sputtered ITO and spin-coated $SnO_2$ nanoparticles.

An illustration of the device is shown in FIG. 12, where a nanocomposite photonic crystal made from $SnO_2$ nanoparticle films and sputtered ITO, shown as layer 340, is deposited onto a glass substrate which is shown as layer 350. An emission layer comprised of a Tris(8-hydroxyquinolinato) aluminium ($Alq_3$) layer at plane 320 and a layer of 4,40-bis[N-(1-napthyl)-N-phenyl-amino]-biphenyl at plane 330 has been deposited via physical vapour deposition onto this nanocomposite photonic crystal. A Lithium Fluoride-Aluminum (LiF/

Al) contact, shown as layer 310, is then deposited onto the emission layer. In this example the LiF/Al contact and the nanocomposite photonic crystal are the reflective layers that form the boundaries of the optical microcavity. In general, layer 310 can be any reflective electrical contact and the emitter layer, sandwiched between this contact and the nanocomposite photonic crystal, can be made from any appropriate material that emits light when a voltage bias is applied across the microcavity.

Figure 13:
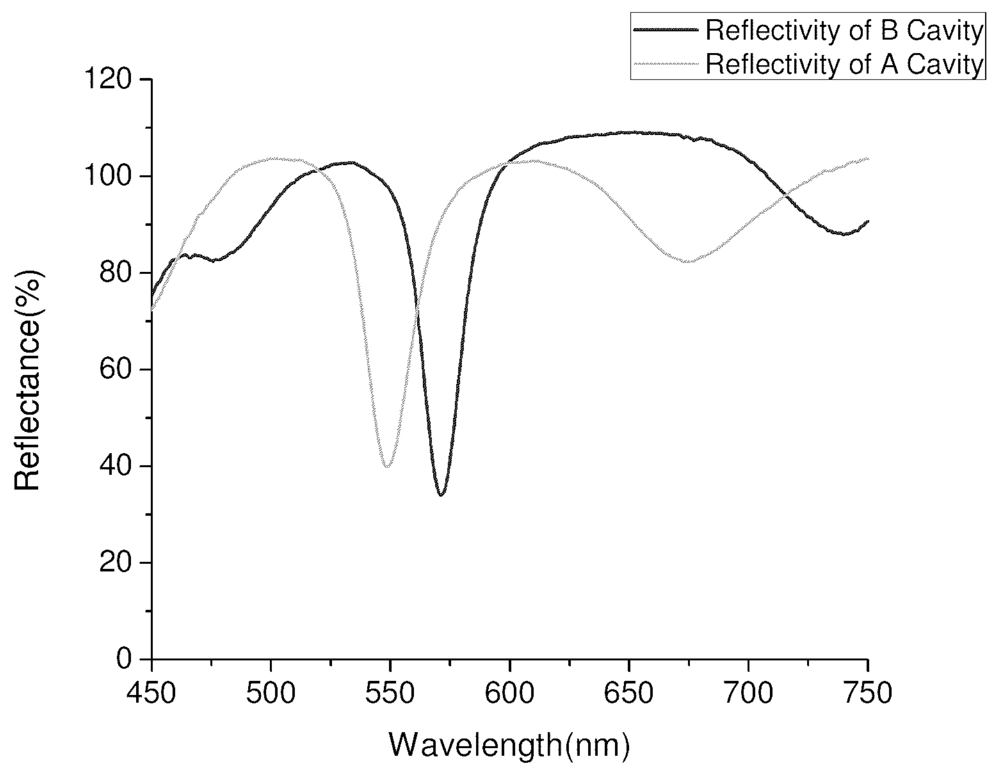
FIG. 13 shows two reflectivity spectra, each corresponding to a cavity with a different Bragg-reflector with a different stop-band position.

FIG. 13 plots measured reflectivity spectra from two OLED microcavities (A and B), each corresponding to a cavity with a different Bragg reflector with a different stopband position and the same cavity as well as mirror thickness. The cavity mode is directly evident from the provided reflectivity spectra of the OLED microcavities as a narrow transmission dip.

Figure 14:
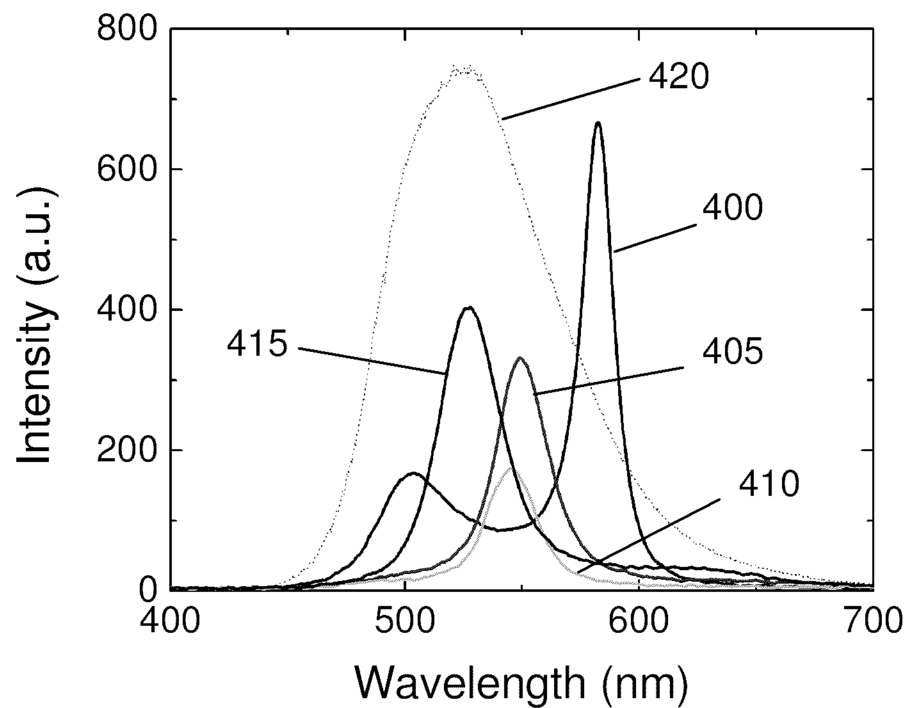
FIG. 14 shows electroluminescence (EL) spectra from the organic light emitting diode (OLED) structures incorporating selectively transparent conducting Bragg-reflectors functioning as the anode, and an EL spectra from an OLED structure comprising a conventional ITO anode is shown for comparison.

Emission spectra from microcavities A and B are shown in FIG. 14. The cavity modes effectively overlap the electroluminescence (EL) emission of the emitter, namely Tris(8-hydroxyquinolinato) aluminum ($Alq_3$), in the fabricated OLEDs and so the resonance condition is satisfied. EL spectra confirm a resonant cavity effect as the emission of the $Alq_3$ emitter is significantly narrowed compared to its EL from a conventional OLED. Shown in the Figure are spectra for microcavity A and B, both at 90° relative to the substrate plane at 400 and 405, respectively, and 45° relative to the substrate plane at 410 and 415, respectively. The spectrum for a device with only an ITO back reflector (i.e. without a Bragg reflector) is shown at 420.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

REFERENCES

[1] C. J. Brinker, Y. Lu, A. Sellinger, H. Fan, Adv. Mater. 11, 579-585 (1999) "Evaporation-Induced Self-Assembly: Nanostructures Made Easy".

[2] D. Fattakhova-Rohlfing, T. Brezesinski, J. Rathuoský, A. Feldhoff, T. Oekermann, M. Wark, B. Smarsly, Adv. Mater. 18, 2980-2983 (2006). "Transparent Conducting Films of Indium Tin Oxide with 3D Mesopore Architecture".

[3] C. Goebbert, R. Nonninger, M. A. Aegerter, H. Schmidt, Thin Solid Films, 351, 79-84, (1999) "Wet chemical deposition of ATO and ITO coatings using crystalline nanoparticles redispersable in solutions".

[4] T. G. Conti, A. J. Chiquito, R. O. da Silva, E. Longo, E. R. Leite, J. Am. Ceram. Soc., pg. 1-5, (2010) "Electrical Properties of Highly Conducting $SnO_2$:Sb Nanocrystals Synthesized Using a Nonaqueous Sol-Gel Method".

[5] H. Lin, T. Jin, A. Dmytruk, M. Saito, T. Yazawa, J. Photochem. Photobiol., A, 164, 173-177, (2004) "Preparation of a porous ITO electrode".

[6] Yablonovitch, Phys. Rev. Lett. 58, 2059-2062 (1987) "Inhibited spontaneous emission in solid-state physics and electronics".

[7] John; Phys. Rev. Lett. 58, 2486-2489 (1987) "Strong localization of photons in certain disordered dielectric superlattices".

[8] J. D. Joannopoulos, S. G. Johnson, J. N. Winn, R. D. Meade, *Photonic Crystals: Molding the Flow of Light,* $2^{nd}$ ed., Princeton Univ. Press, Princeton, N.J. 2008.

[9] L. Rayleigh, *Philos. Mag.,* 24, 145-159 (1887) "On the maintenance of vibrations by forces of double frequency, and on the propagation of waves through a medium endowed with a periodic structure."

[10] M. Scalora, J. P. Dowling, C. M. Bowden, M. J. Bloemer, *J. Appl. Phys.* 76, 2023-2026 (1994) "The photonic band edge optical diode".

[11] J. N. Winn, Y. Fink, S. Fan, J. D Joannopoulos, *Optics Letters,* 23, 1573-1575 (1998) "omnidirectional reflection from a one-dimensional photonic crystal".

[12] Y. Fink, J. N. Winn, S. Fan, C. Chen, J. Michel, J. D. Joannopoulos, E. L. Thomas, *Science,* 282, 1679-1682 (1998) "A dielectric omnidirectional reflector". [13] G. R. Fowles, *Introduction to modern optics,* $2^{nd}$ ed., Ch 4, Dover Publications, New York, 1975.

[14] H. Kogelnik, C. V. Shank, *J. Appl. Phys.* 43, 2327-2335 (1972) "Coupled-wave theory of distributed feedback lasers".

[15] N. Kaiser, H. K. Pulker, *Optical interference Coatings, pp.* 455-478, Springer-Verlag Berlin Heidelberg, 2003.

[16] L. D. Bonifacio, B. V. Lotsch, D. P. Puzzo, F. Scotognella, G. A. Ozin, *Adv. Mater.,* 21, 1641-1646 (2009) "Stacking the nanochemistry deck: structural and compositional diversity in one-dimensional photonic crystals".

[17] D. P. Puzzo, L. D. Bonifacio, J. Oreopoulos, C. M. Yip, I. Manners, G. A. Ozin, *J. Mat. Chem.,* 19, 3500-3506 (2009) "Color from colorless nanomaterials: Bragg-reflectors made of nanoparticles".

[18] S. Y. Choi, M. Mamak, G. Von Frevmann, N. Chopra, G. A. Ozin, *Nano Lett.,* 6, 2456-2461 (2006) "Mesoporous Bragg-stack color tunable sensors".

[19] M. C. Fuertes, F. J. López-Alcaraz, M. C. Marchi, H. E. Troiani, V. Luca, H. Míguez, G. J. De A. A, Soler-Illia, *Adv. Funct. Mater.* 17, 1247-1254 (2007) "Photonic crystals from ordered nanoporous thin-film functional building blocks".

[20] M. E. Calvo, S. Colodrero, T. C. Rojas, J. A. Anta, M. Ocaña, H. Míguez, *Adv. Funct. Mat.,* 18, 2708-2715 (2008) "Photoconducting Bragg-mirrors based on $TiO_2$ nanoparticle multilayers".

[21] S. Colodrero, M. Ocaña, H. Míguez, *Langmuir,* 24, 4430-4434 (2008) "Nanoparticle-based one-dimensional photonic crystals".

[22] S. Colodrero, A. Mihi, L. Häggman, Manuel Ocaña, Gerrit Boschloo, A. Hagfeldt, H. Míguez, *Adv. Mater.,* 21, 764-770 (2009) "Porous one-dimensional photonic crystals improve the power-conversion efficiency of dye-sensitized solar cells".

[23] S. Kawakami, *Electron. Lett.* 33, 1260-1261 (1997) "Fabrication of submicrometre 3D periodic structures composed of $Si/SiO_2$"

[24] C. C. Cheng, A. Scherer, R. Tyan, Y. Fainman, G. Witzgall, E. Yablonovitch, *J. Vac. Sci. Technol. B* 15(6), 2764-2767 (1997) "New Fabrication Techniques for High Quality Photonic Crystals".

[25] R. M. Navarro, M. C. Alvarez-Galván, J. A. Villoria de la Mano, S. M. Al-Zahrani, J. L. G. Fierro, *Energy Environ. Sci.*, Advance Article (2010) "A framework for visible-light water splitting",

[26] M. Ni, M. K. H. Leung, D. Y. C. Leung, K. Sumathy, *Renewable Sustainable Energy Rev.,* 11, 401-425, (2007).

[27] L. Li, M. Liming, D. Xuechen, *Mater. Res. Bull.,* 41, 541-546 (2006) "Solvothermal synthesis and characterization of Sb-doped $SnO_2$ nanoparticles used as transparent conductive films".

[28] C. Goebbert, H. Bisht, N. Al-Dahoudi, R. Nonninger, M. A. Aegerter, H. Schmidt, *J. Sol-Gel Sci. Tech.,* 19, 201-204 (2000) "Wet chemical deposition of crystalline, redispersable ATO and ITO nanoparticles".

[29] M. Higuchi, S. Uekusa, R. Nakano, K. Yokogawa, *Jpn. J. Appl. Phys.,* 33, 302-306 (1994) "Postdeposition annealing influence on sputtered indium tin oxide film characteristics".

[30] J. Meier, S. Dubail, R. Flëckiger, D. Fischer, H. Keppner, A. Shah, in *Proceedings of the 1st* World Conference on Photovoltaic Energy Conversion, 1, 409-412, (1994) "Intrinsic microcrystalline silicon (μc-Si:H)—a promising new thin film solar cell material,"

[31] A. Shah, J. Meier, E. Vallat-Sauvain, C. Droz, U. Kroll, N. Wyrsch, J. Guillet, U. Graf, *Thin Solid Films,* 179, 403-404, (2002) "Microcrystalline silicon and "micromorph" tandem solar cells,".

[32] Martí, G. L. Araújo, *Sol. Energy Mater. Sol. Cells,* 43, 203-222, (1996) "Limiting efficiencies for photovoltaic energy conversion in multigap systems,"

[33] D. L. Staebler, C. R. Wronski, *App Phys. Lett.,* 31, 292-294 (1977) "Reversible conductivity changes in discharge-produced amorphous Si."

[34] A. V. Shah, R. Platz, H. Keppner, *Sol. Energy Mater. Sol. Cells* 38, 501-520. (1995) "Thin-film silicon solar cells: A review and selected trends,"

[35] D. M. Whittaker, I. S. Culshaw, *Phys. Rev. B,* 60, 2610-2618 (1999) "Scattering-matrix treatment of patterned multilayer photonic structures"

[36] M. Liscidini, D. Gerace, L. C. Andreani, J. E. Sipe, *Phys. Rev. B,* 77, 035324 (2008) "Scattering-matrix analysis of periodically patterned multilayers with asymmetric unit cells and birefringent media"

[37] ASTMG 173-03, *Standard Tables for Reference Solar Spectral Irradiances: Direct Normal and Hemispherical on* 37 *degree Tilted Surface* (ASTM International, West Conshohocken, Pa., 2005).

[38] P. G. O'Brien, A. Chutinan, K. Leong, N. P. Kherani, G. A. Ozin, S. Zukotynski, *Opt. Exp.,*18, 4478-4490, (2010) "Photonic crystal intermediate reflectors for micromorph solar cells: a comparative study".

[39] P. J. Zanzucchi, C. R. Wronski, D. E. Carlson, J. Appl. Phys. 48, 5227-5236, (1997) "Optical and photoconductive properties of discharge-produced amorphous silicon"

[40] A. V. Shah, H. Schade, M. Vanekek, J. Meier, E. Vallat-Sauvain, N. Wyrsch, U. Kroll, C. Droz, J. Bailat, Progress in Photovoltaics: Research and Applications 12, 113-142 (2004) "Thin-film silicon solar cell technology"

[41] L. Meng, M. dos Santos, *Vacuum,* 46, 1001-1004 (1995) "Characterization of ZnO films prepared by dc reactive magnetron sputtering at different oxygen partial pressures"

[42] David F. Edwards, "Silicon (Si)", in *Handbook of Optical Constants of Solids*, (Ed: E. D. Palik), Academic, Orlando, Fla. (1985).

[43] B. Lalovic, Solar Cells, 19, 131-138 (1986) "A hybrid amorphous silicon photovoltaic and thermal solar collector"

[44] H. A. Zondag, Renewable Sustainable Energy Rev. 12, 891, (2008) "Flat-plate PV-Thermal collectors and systems: A review"

[45] M. J. Brett, M. M. Hawkeye, Science, 319, 1192-1193 (2008) "New materials at a glance".

[46] A. Bielawny et al., Phys. Stat. Sol. (a) 205, 2796-2810 (2008) "3D photonic crystal intermediate reflector for micromorph thin-film tandem solar cell"

[47] L. Zhou, Y. Wang, H. Zhou, M. Li, R. L. Headrick, Physical Review B 82, 075408 (2010), "Pressure-dependent transition from atoms to nanoparticles in magnetron sputtering: Effect on WSi2 film roughness and stress".

[48] S. J. Hong, J. Han, J Electroceram 17, 821-826, (2006), "Synthesis and characterization of indium tin oxide (ITO) nanoparticle using gas evaporation process"

[49] K. Utsumi, H. ligusa, R. Tokumaru, P. K. Song, Y. Shigesato, Thin Solid Films 445, 229-234, (2003), "Study on In2O3-SnO2 transparent and conductive films prepared by d.c. sputtering using high density ceramic targets"

Therefore what is claimed is:

1. A porous nanocomposite comprising:

a nanoparticle layer having a network of pores formed therein, said nanoparticle layer providing a transparent and porous nanoparticle matrix; wherein said pores are internally coated with a transparent conductive material such that said transparent conductive material defines a conductive path within said porous nanoparticle layer; and an additional transparent conductive layer contacting said nanoparticle layer, such that said nanoparticle layer and said additional transparent conductive layer define a transparent conductive bilayer;

wherein said pores are internally coated with said transparent conductive material such that the porosity of said porous nanoparticle matrix is preserved, and wherein a volume fraction of said transparent conductive material is selected to such that the nanoparticle layer has a lower effective refractive index than the effective refractive index of said additional transparent conductive layer.

2. The porous nanocomposite according to claim 1 wherein said transparent conductive material is selected from the group consisting of metallic films that are sufficiently thin to exhibit transparency, transparent conductive oxides, transparent conductive polymers, semiconductors, doped semiconductors, doped carbon films, and organic transparent conducting films.

3. The porous nanocomposite material according to claim 1 wherein a mean pore diameter of said nanoparticle matrix is less than about 25 nm.

4. The porous nanocomposite according to claim 1 wherein nanoparticles forming said porous nanoparticle matrix comprise a property selected from the group consisting of magnetic, luminescent, and exhibiting a plasmon resonance before and/or after being infiltrated and coated with said transparent conductive material.

5. The porous nanocomposite according claim 1 wherein nanoparticles forming said porous nanoparticle matrix have a shape selected from the group consisting of spherical, cylindrical, disks, platelets, hollow spheres and tubes.

6. The porous nanocomposite according claim 1 wherein nanoparticles forming said porous nanoparticle matrix comprise a material selected from the group consisting of metals, metal oxides, semiconductors, polymers, carbon materials, and organics.

7. The porous nanocomposite according to claim 1 wherein nanoparticles forming said porous nanoparticle matrix further comprise a surface that is one of passivated, modified using surfactants, oxidized, functionalized, and bound and/or coated with a bio-recognition species.

8. The porous nanocomposite according to claim 1 wherein said conductive path extends across a thickness of said porous nanocomposite.

9. The porous nanocomposite according to claim 1 wherein a volume fraction of said transparent conductive material varies across a thickness of said porous nanocomposite.

10. The porous nanocomposite according to claim 1 wherein said additional transparent conductive layer includes a substantially solid, non-porous material.

11. The porous nanocomposite according to claim 10 further comprising one or more additional transparent conductive bilayers, wherein a thickness of each bilayer is selected such that said porous nanocomposite is optically reflective at a selected wavelength due to Bragg reflection.

12. The porous nanocomposite according to claim 1 wherein said nanoparticle layer internally coated with said transparent conductive material is a first transparent conductive nanocomposite layer, and wherein said additional transparent conductive layer is a second transparent conductive nanocomposite layer;

wherein said first transparent conductive nanocomposite layer has a different effective refractive index than said second transparent conductive nanocomposite layer.

13. The porous nanocomposite according to claim 1 further comprising one or more additional transparent conductive bilayers, wherein a thickness of each bilayer is selected such that said porous nanocomposite is optically reflective at a selected wavelength due to Bragg reflection.

14. A tandem solar cell comprising:

a first photovoltaic region;

an intermediate Bragg reflector comprising a porous nanocomposite according to claim 13; and a second photovoltaic region, wherein a reflectivity peak of said intermediate reflector comprises a spectral range corresponding to at least a portion of an absorption band of said first photovoltaic region.

15. A light emitting device comprising:

a first conductive reflective layer;

an emitter layer contacting said first conductive reflective layer, wherein said emitter layer is configured to emit light in response to an applied voltage; and a Bragg reflector contacting said active layer, said Bragg reflector comprising a porous nanocomposite according to claim 13.

16. A photovoltaic system comprising:

a photovoltaic cell configured to absorb light within a first spectral region and transmit light within a second spectral region; and a reflector comprising a porous nanocomposite according to claim 13;

wherein a reflectivity peak of said reflector comprises a spectral range corresponding to at least a portion of said first spectral region; and wherein said reflector electrically contacts said photovoltaic cell.

17. The photovoltaic system according to claim 16 wherein at least a portion of said second spectral region is suitable for providing light or heat to an interior of a building.

* * * * *